United States Patent
Fukute et al.

(10) Patent No.: US 7,808,209 B2
(45) Date of Patent: Oct. 5, 2010

(54) REMAINING BATTERY CHARGE CALCULATION SYSTEM IN ELECTRONIC DEVICE

(75) Inventors: Ryuji Fukute, Kawasaki (JP); Hidenori Shiba, Tokyo (JP); Go Togashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 565 days.

(21) Appl. No.: 11/693,184

(22) Filed: Mar. 29, 2007

(65) Prior Publication Data

US 2007/0229035 A1    Oct. 4, 2007

(30) Foreign Application Priority Data

Mar. 31, 2006  (JP)  ............................. 2006-099857
Apr. 4, 2006   (JP)  ............................. 2006-103650
Apr. 7, 2006   (JP)  ............................. 2006-106499

(51) Int. Cl.
    *H02J 7/00*  (2006.01)
(52) U.S. Cl. ........................ 320/132; 320/134; 324/429
(58) Field of Classification Search .................. 320/132, 320/134, 136; 324/427, 429
    See application file for complete search history.

(56) References Cited

U.S. PATENT DOCUMENTS 4,438,431 A * 3/1984 Toyomura .................. 340/663

2005/0088138 A1 * 4/2005 Sasaki ...................... 320/101
2005/0225295 A1 * 10/2005 Sato ......................... 320/132

FOREIGN PATENT DOCUMENTS

JP    2004-150951    5/2004

OTHER PUBLICATIONS

Raw Machine Translation of JP 2004-150951 (Yamada), May 27, 2004.*

* cited by examiner

*Primary Examiner*—Edward Tso
*Assistant Examiner*—Aaron Piggush
(74) *Attorney, Agent, or Firm*—Cowan, Liebowitz & Latman, P.C.

(57) ABSTRACT

An electronic device has a voltage converter configured to convert output voltage of a battery for supplying power for operating an electronic device into a preset voltage for output, a constant current load unit configured to receive the voltage output by the voltage converter and output a preset constant current, a battery voltage detector configured to detect the output voltage of the battery, and a remaining charge calculator configured to calculate the remaining charge of the battery based on a first battery voltage obtained by the battery voltage detector when operation of the constant current load unit is stopped and a second battery voltage obtained by the battery voltage detector when the constant current load unit is operating.

6 Claims, 18 Drawing Sheets

REMAINING BATTERY CHARGE CALCULATION SYSTEM IN ELECTRONIC DEVICE

BACKGROUND OF THE INVENTION

1. Field of the Invention

The present invention relates to a system for calculating the remaining charge of a battery used in an electronic device such as a portable electronic device.

2. Description of the Related Art

Portable electronic devices use batteries to supply power for the operation of the device. As such portable electronic devices there are, for example, digital cameras, video cameras, mobile phones and the like.

A portable electronic device like those described above is constructed so as to accurately grasp the actual remaining charge of a battery. For example, in JP-A-2004-150951, a structure in which serially connected resistors and switching elements are connected in parallel to the battery is disclosed. The structure comprises a battery control means that acquires information relating to changes in the voltage of the battery detected by a battery voltage detection means by switching the switching elements on and outputting an electric current from the battery to the resistors. The battery control means determines the remaining charge of the battery on the basis of the information relating to changes in the voltage of the battery (see JP-A-2004-150951).

A portable electronic device like that described above, when carrying out an operation that consumes a lot of power, only begins to do so after determining whether or not such an operation is feasible with the present remaining battery charge. One example of a conventional remaining battery charge detection circuit provided for this purpose is shown in the block diagram of FIG. 16, using the example of a digital camera.

A description will now be given of the operation of the conventional remaining battery charge detection circuit, using FIG. 16.

As shown in FIG. 16, a battery voltage detector 506 and a constant current load unit 505 capable of outputting a constant current are connected in parallel to a battery 501. The constant current load unit 505 is constructed so as to be susceptible to ON/OFF control. The battery voltage detector 506 comprises voltage-dividing resistors R1, R2 serially connected.

A power supply unit 502 that supplies power to a digital camera system 503 converts the voltage of the battery 501, generates multiple types of voltages required by the digital camera system 503, and supplies power. A controller 504 controls the digital camera system 503 as a whole. It should be noted that FIG. 16 shows only the blocks relating to the remaining battery charge detection circuitry.

A power supply control unit 510 controls the power supply unit 502, switching ON the voltage supplied from the power supply unit 502 deemed necessary to operate the digital camera and switching OFF the voltage deemed unnecessary. Operating switches 508 include a release switch, a mode switch for selecting an operating mode and the like, for inputting operating instructions.

The operating switches 508 are connected to a switch state detector 509 that monitors the state of the operating switches 508. A constant current load control unit 511 switches the constant current load unit 505 ON/OFF depending on information relating to the switch state as detected by the switch state detector 509.

The battery voltage detector 506 causes a divided battery voltage detection signal to be supplied to an A/D converter 512, where the battery voltage information is converted into a digital value by the A/D converter 512. A remaining charge calculator 514 then calculates the remaining battery charge using the battery voltage information supplied from the A/D converter 512 and coefficients provided for each operating state and recorded in a coefficient recording unit 513. A remaining charge display unit 507 displays the remaining battery charge results calculated by the remaining charge calculator 514.

Next, a description is given of the operation of a remaining battery charge estimation circuit constructed as described above, while referring to the flow chart shown in FIG. 17.

Once the main power to the remaining battery charge estimation circuit is thrown and the circuit begins to operate, initially, it is determined whether or not a camera operating instruction has been input using the operating switches 508 (step S601). If the results of the determination indicate that a camera operating instruction has not been input, the camera stands by until such input.

If the results of the determination made in step S601 indicate that a camera operating instruction has been input, then the digital camera system 503, through the battery voltage detector 506, acquires present battery voltage information V0 digitally converted by the A/D converter 512 (step S602).

After acquiring the present battery voltage information V0, the constant current load control unit 511 switches the constant current load unit 505 ON and a predetermined load current $I_L$ flows from the battery 501 (step S603). The digital camera system 503 then acquires battery voltage information V1, which is the battery voltage at this time, digitally converted by the A/D converter 512 (step S604). After acquiring the battery voltage information V1 in step S604, the constant current load control unit 511 switches the constant current load unit 505 OFF (step S605). The following calculation process and comparison are then carried out at the remaining charge calculator 514 (step S606):

$$Vth < V0 - K\Delta V \quad (1)$$

$$\Delta V = V0 - V1 \quad (2)$$

where Vth is a predetermined lower limit threshold voltage at which the camera can operate and K is an arbitrary operating mode coefficient predetermined for each camera operation input using the operating switches 508, which is stored in the coefficient recording unit 513.

If as a result of the calculation process and comparison described above and carried out at the remaining charge calculator 514 (step S606) it is determined that the results of the calculation process are greater than the lower limit threshold voltage Vth, it is then determined that the operation input in step S601 can be executed, operation is started (step S607), and, when the desired operation is completed, operation is ended (step S608).

If as a result of the calculation process and comparison carried out in step S606 described above it is determined that the results of the calculation process are equal to or less than the lower limit threshold voltage Vth, it is then determined that the operation input in step S601 cannot be executed and a replace-battery sign is displayed on the remaining battery charge display unit 507 (step S609). Next, the power supply control unit 510 switches the power supply unit 502 OFF (step S610). Documents that describe this configuration include JP-A-2004-61393 and JP-A-2004-150951.

In general, the smaller the drop voltage ΔV the greater the relative proportion of A/D conversion quantification error and error due to non-uniformity in the components of the battery voltage detector 506. As a result, the smaller the drop voltage $\Delta V$ the lower the accuracy of the remaining battery charge calculation, and conversely, the greater the drop voltage $\Delta V$ the higher the accuracy of the remaining battery charge calculation. Moreover, since the drop voltage $\Delta V$ increases in proportion to the load power ($P_L$=battery voltage×load current $I_L$), the accuracy of the remaining battery charge calculation is proportional to the load power $P_L$.

By contrast, it is known that, as shown in the characteristics graph showing the relation between voltage and running time in FIG. 18, with the battery 501 typically used in a portable electronic device such as a digital camera the battery voltage falls as the remaining charge declines. Therefore, connecting the constant current load unit 505 to the battery voltage as in the conventional arrangement reduces the load power $P_L$ when the remaining battery charge is low, which is just when high detection accuracy is needed most. As a result, remaining battery charge detection accuracy declines.

Conversely, even when the remaining battery charge is adequate and the battery voltage is high, a remaining charge estimate is always performed prior to operation using the predetermined load current $I_L$. When the battery voltage is high the load power $P_L$ increases, which causes a large power loss due to the remaining battery charge calculation operation.

SUMMARY OF THE INVENTION

The present invention has been made in consideration of the above situation, and has as its object to enable detection accuracy of remaining battery charge to be improved as well as to enable unnecessary consumption of battery power to be prevented.

According to one aspect of the present invention, an electronic device comprises:

a voltage converter configured to convert output voltage of a battery for supplying power for operating the electronic device into a preset voltage for output;

a constant current load unit configured to receive the voltage output by the voltage converter and output a preset constant current;

a battery voltage detector configured to detect the output voltage of the battery; and a remaining charge calculator configured to calculate a remaining charge of the battery based on a first battery voltage obtained by the battery voltage detector when operation of the constant current load unit is stopped and a second battery voltage obtained by the battery voltage detector when the constant current load unit is operating.

According to another aspect of the present invention, a remaining battery charge calculation method, comprises:

a voltage conversion step of converting output voltage of a battery for supplying power for operating the remaining battery charge calculation method into a preset voltage by a voltage converter for output;

a constant current load step of receiving the voltage output by the voltage converter at a constant current load unit and outputting a preset constant current at the constant current load unit;

a battery voltage detection step of detecting the output voltage of the battery; and a remaining battery charge calculation step of calculating a remaining charge of the battery based on a first battery voltage obtained in the battery voltage detection step when operation of the constant current load unit is stopped and a second battery voltage obtained in the battery voltage detection step when the constant current load unit is operating.

According to still another aspect of the present invention, an electronic device comprises:

a battery configured to supply power to an electronic device;

a battery voltage detector configured to detect voltage of the battery;

a current load unit configured to output current from the battery;

an operating unit configured to input an operating instruction for operating the electronic device;

a current setting unit configured to set a current of the current load unit based on an operating instruction input from the operating unit; and a remaining charge calculator configured to calculate a remaining battery charge based on a first battery voltage obtained by the battery voltage detector when operation of the current load unit is stopped and a second battery voltage obtained by the battery voltage detector when a current set by the current setting unit is output to the current load unit.

According to another aspect of the present invention, a control method for an electronic device, the electronic device comprises:

a battery configured to supply power to an electronic device;

a battery voltage detector configured to detect voltage of the battery;

a current load unit configured to output current from the battery; and an operating unit configured to input an operating instruction for operating the electronic device, the control method for electronic device comprising:

a current setting step of setting a current of the current load unit based on an operating instruction input from the operating unit;

an acquisition step of obtaining a first battery voltage detected by the battery voltage detector when the current load unit is stopped and a second battery voltage detected by the battery voltage detector when a current set in the current setting step is output to the current load unit; and a remaining charge calculation step of calculating a remaining battery charge based on the first battery voltage and the second battery voltage obtained in the acquisition step.

According to still another aspect of the present invention, an electronic device comprises:

a power supply unit configured to convert voltage supplied from a battery into a preset voltage;

a constant current load unit configured to output a predetermined constant current from the battery;

a battery voltage detector configured to detect a first battery voltage when the constant current load unit is stopped and a second battery voltage when the constant current load unit is operating;

an operating unit configured to input an operating instruction for operating the electronic device;

a comparison unit configured to compare the first battery voltage with a preset voltage when an operating instruction is input from the operating unit; and a remaining charge calculator that calculates a remaining battery charge based on the first battery voltage and the second battery voltage detected by the battery voltage detector if results of a comparison conducted by the comparison unit indicate that the first battery voltage is at or below the preset voltage.

According to another aspect of the present invention, a control method for an electronic device, the electronic device comprises:

a power supply unit configured to convert voltage supplied from a battery into a preset voltage;

a constant current load unit configured to output a predetermined constant current from the battery;

a battery voltage detector configured to detect a first battery voltage when the constant current load unit is stopped and a second battery voltage when the constant current load unit is operating; and an operating unit configured to input an operating instruction for operating the electronic device, the control method for electronic device comprising:

a comparison step of comparing the first battery voltage with a preset voltage when an operating instruction is input from the operating unit; and a remaining charge calculation step of calculating a remaining battery charge based on the first battery voltage and the second battery voltage detected by the battery voltage detector if results of a comparison conducted by the comparison unit indicate that the first battery voltage is at or below the preset voltage.

Further features of the present invention will become apparent from the following description of exemplary embodiments (with reference to the attached drawings).

DESCRIPTION OF THE EMBODIMENTS

Preferred embodiments of the present invention will now be described in detail in accordance with the accompanying drawings. The dimensions, materials, shapes and relative positions of the constituent part shown in the embodiment should be changed as convenient depending on various conditions and on the structure of the apparatus adapted to the invention, and the invention is not limited to the embodiments described herein.

First Embodiment

Below, a description is given of an example in which a first embodiment of the present invention is adapted to a digital camera, based on FIG. 1 and FIG. 2.

Figure 1:
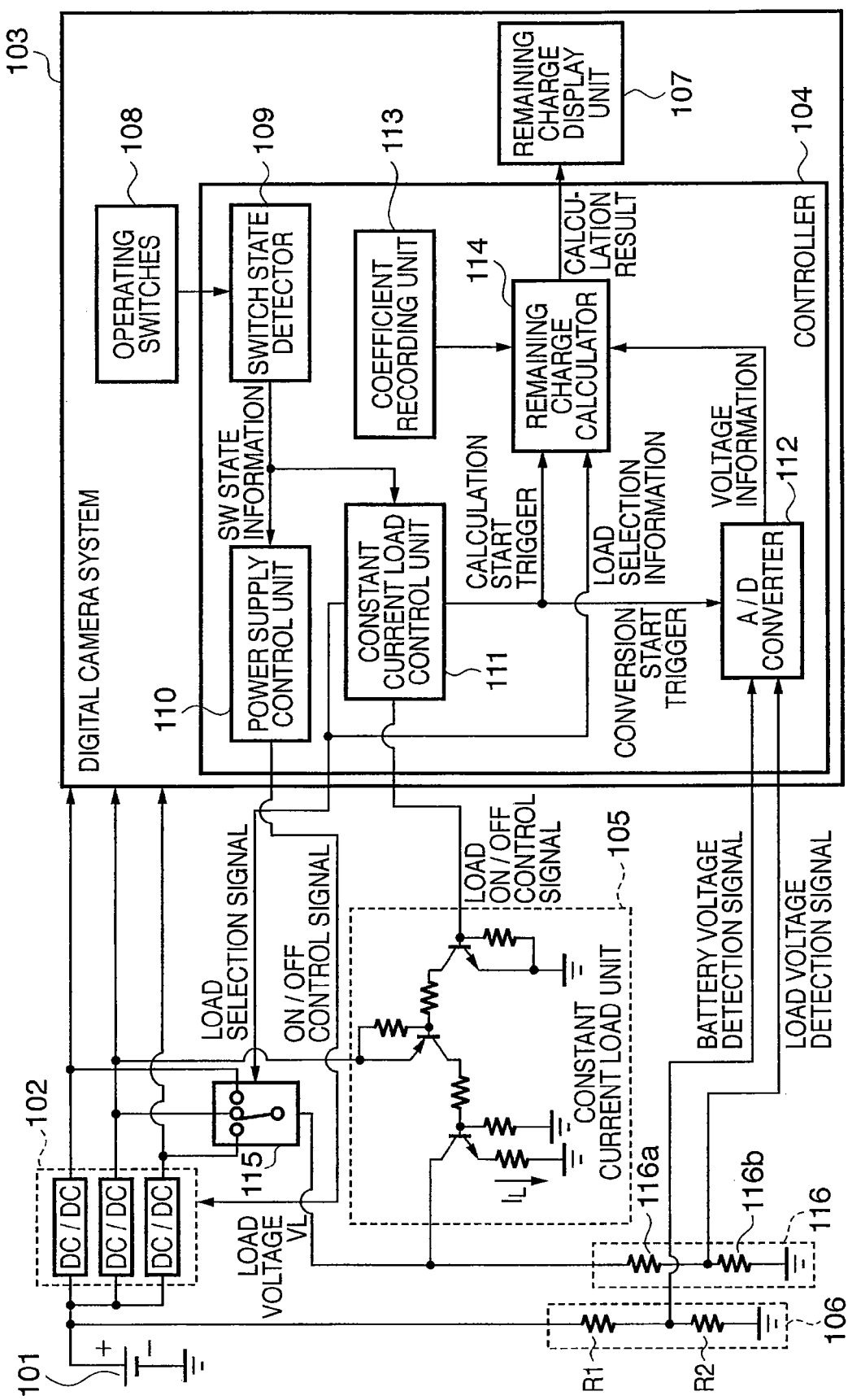
FIG. 1 is a block diagram illustrating the major components of an electronic device according to a first embodiment of the present invention.

First, a description is given of structure according to the first embodiment, using the block diagram shown in FIG. 1. In the first embodiment, there is a battery 101 that supplies power to the digital camera and a power supply unit 102 that converts the voltage supplied by the battery 101 into preset output voltages $V_{DC1}, V_{DC2}, V_{DC3}$ needed to operate a digital camera system 103. It should be noted that the output voltages $V_{DC1}, V_{DC2}, V_{DC3}$ are such that $V_{DC1} > V_{DC2} > V_{DC3}$.

In addition, the first embodiment comprises a controller 104 that controls the entire digital camera system 103, operating switches 108 that detect operation by a user, a battery voltage detector 106 that measures the battery voltage, and a constant current load unit 105 that holds a load switching unit load current at a constant value. The first embodiment further comprises a load switching unit 115 that switches the connections that are connected to the constant current load unit 105, a load voltage detector 116 that measures the load voltage, and a remaining charge display unit 107 that displays a replace-battery sign.

The controller 104 comprises a switch state detector 109, a power supply control unit 110, an A/D converter 112, a coefficient recording unit 113 and a remaining charge calculator 114.

The switch state detector 109 detects the state of the operating switches 108 and outputs switch state information. The power supply control unit 110 outputs ON/OFF signals to the power supply unit 102 to supply the power needed to operate in response to the switch state information. The A/D converter 112 converts the analog signals of the battery voltage detector 106 and the load voltage detector 116 into digital signals.

The coefficient recording unit 113 stores coefficients used in calculating the remaining battery charge. The constant current load control unit 111 determines from the switch state information whether or not the load switching unit 115 is required, and if required, operates the constant current load unit 105, the load switching unit 115, the remaining charge calculator 114 and the A/D converter 112. The remaining charge calculator 114 determines from the present battery voltage information V0, V1 obtained from the A/D converter 112, the coefficients recorded in the coefficient recording unit 113 and a load selection signal whether or not an operation input from the operating switches 108 is feasible.

Figure 2:
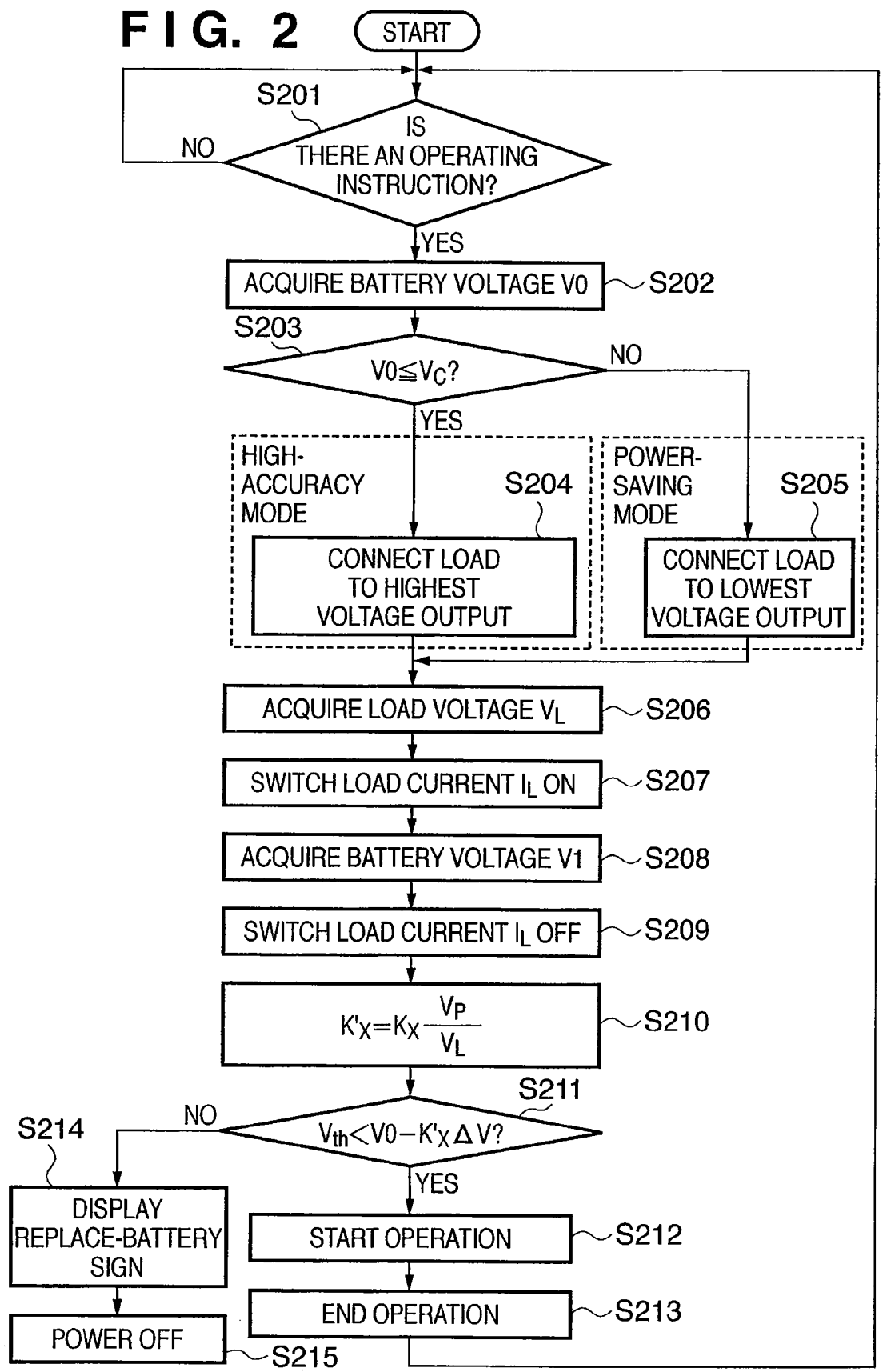
FIG. 2 is a flow chart illustrating processing performed by the electronic device according to the first embodiment of the present invention.

Next, a description is given of the operating order of the first embodiment of the present invention, using the flow chart shown in FIG. 2.

First, in step S201 it is determined whether or not a camera operating instruction has been input from the operating switches 108. If the results of this determination indicate that a camera operating instruction has been input, the process proceeds to step S202 and the digital camera system 103, through the battery voltage detector 106, acquires the present battery voltage information V0 digitally converted by the A/D converter 112. If the results of the determination made in step S201 indicate that a camera operating instruction has not been input, the camera stands by awaiting such input.

Next, it is calculated whether or not the present battery voltage information V0 is equal to or less than a preset high-accuracy mode threshold value $V_C$ (step S203). If the results of this calculation indicate that the present battery voltage information V0 is equal to or less than the high-accuracy mode threshold value $V_C$, the camera shifts to a high-accuracy mode and the highest voltage output $V_{DC1}$ of the output from the power supply unit 102 is connected to the constant current load unit 105 by the load switching unit 115 (step S204).

If the results of the determination made in step S203 indicate that the present battery voltage information V0 is greater than the high-accuracy mode threshold value $V_C$, the camera shifts to a power saving mode and the lowest voltage output $V_{DC3}$ of the output from the power supply unit 102 is connected to the constant current load unit 105 by the load switching unit 115 (step S205).

Next, the digital camera system 103 gets a load voltage detection signal from the connection between a first resistor 116a and a second resistor 116b that comprise the load voltage detector 116, supplies the signal to the A/D converter 112 for digital conversion, and acquires load voltage information $V_L$ (step S206).

Next, the constant current load control unit 111 switches the constant current load unit 105 ON, outputting a predetermined load current $I_L$ from the connected power supply unit 102 (step S207). Then, a load voltage detection signal at the time the load current $I_L$ is output is gotten from the connection between the first resistor 116a and the second resistor 116b and supplied to the A/D converter 112. Then, the load voltage detection signal at this time is digitally converted at the A/D converter 112 and battery voltage information V1 with load is acquired (step S208).

After acquiring the load battery voltage information V1, the constant current load control unit 111 switches the constant current load unit 105 OFF (step S209). Next, the remaining charge calculator 114 carries out a calculation process using the following equations (3) (step S210):

$$K'_X = K_X \cdot \frac{V_P}{V_L} \quad (3)$$

where $K_X$ is an arbitrary coefficient predetermined for each camera operation input using the operating switches 108 and each of the voltage outputs that connects a load, such coefficient being stored in the coefficient recording unit 113. In addition, $V_P$ is the load voltage at the time that coefficient is determined. By this calculation, a coefficient $K'_X$ corrected not by a preset $V_P$ but by the actual load voltage $V_L$ at remaining charge calculation is obtained. Next, using this $K'_X$ the remaining charge calculator 114 carries out a calculation process and comparison using the following equations (4) and (5) (step S211):

$$Vth < V0 - K'_X \Delta V \quad (4)$$

$$\Delta V = V0 - V1 \quad (5)$$

where Vth is a predetermined lower limit threshold voltage at which camera operation is feasible. If the results of the calculation process and comparison carried out by the remaining charge calculator 114 and described above (step S211) indicate that the calculation process results are greater than the lower limit threshold voltage Vth, it is determined that the operation input in step S201 can be executed and operation is begun (step S212). Then, once the desired operation is completed, operation is ended (step S213).

If the results of the calculation process and comparison described above (step S211) indicate that the calculation process results are equal to or less than the lower limit threshold voltage Vth, then it is determined that the operation input in step S201 cannot be executed and a replace-battery sign is displayed on the remaining charge display unit 107 (step S214). Next, the power supply control unit 110 switches the power supply unit 102 OFF (step S215).

The first embodiment described above, because it connects the constant current load unit 105 to the power supply unit 102 output terminals, can prevent a decline in remaining charge detection accuracy as the load power falls when the remaining battery charge is low.

In addition, as the remaining battery charge is low and the battery voltage is low, the constant current load unit 105 is connected to the highest-voltage power supply unit 102 output, and therefore the load power increases so as to enable more accurate calculation of the remaining battery charge.

In addition, the power supply unit 102 that is connected to the constant current load unit 105 acquires the actual output voltage at the time the remaining charge is calculated and reflects that voltage in the remaining battery charge calculation, which enables the remaining battery charge to be calculated with greater accuracy than when using the rated output voltage of the power supply unit 102. At the same time, when the remaining battery charge is high and the battery voltage is high the constant current load unit 105 is connected to the lowest-voltage power supply unit 502 output terminal, which enables the load power to be kept low and enables unnecessary load power to be restrained.

Second Embodiment

Below, a description is given of an example in which a second embodiment of the present invention is adapted to a digital camera, using FIG. 3 and FIG. 4.

Figure 3:
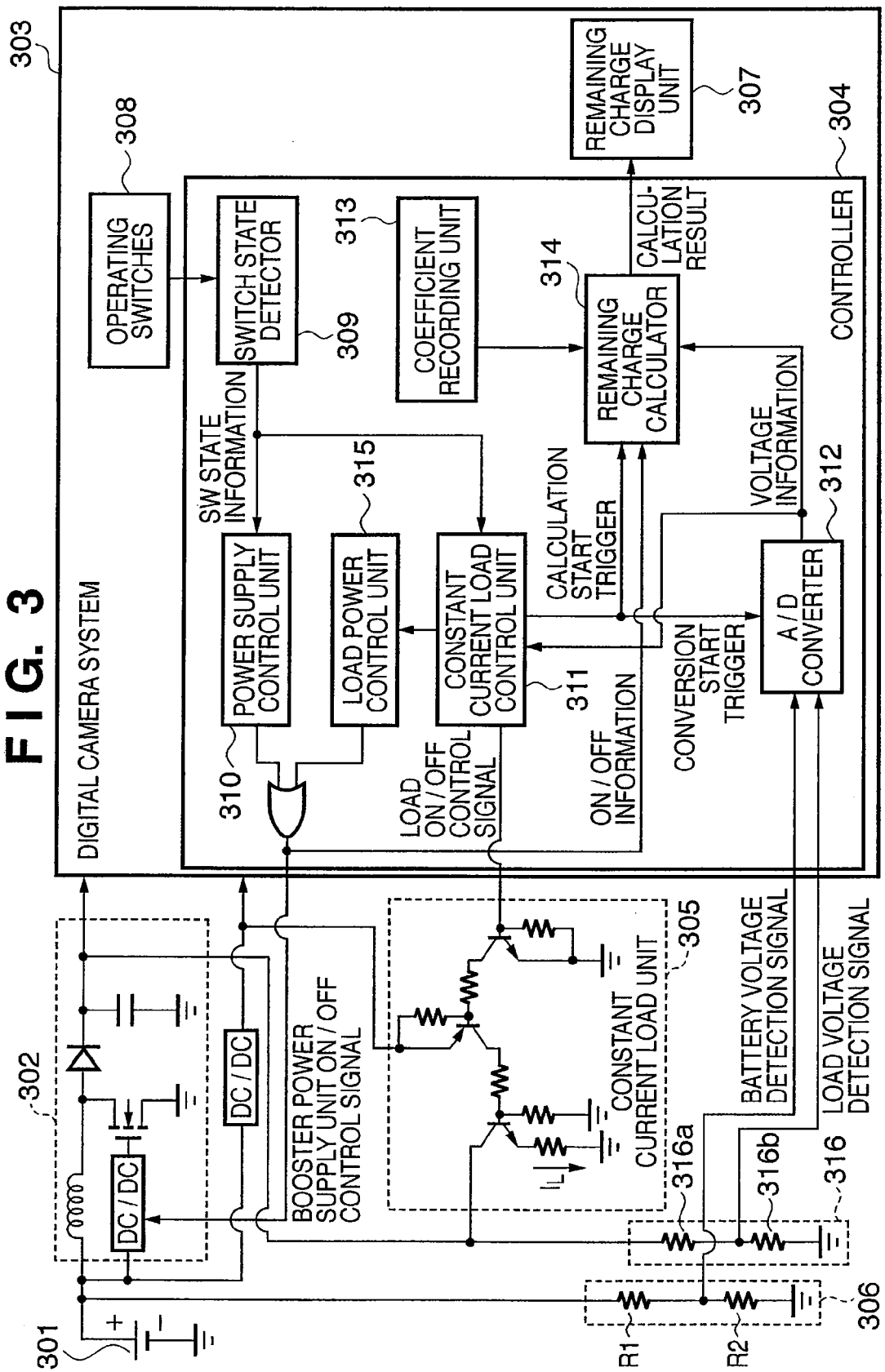
FIG. 3 is a block diagram illustrating the major components of an electronic device according to a second embodiment of the present invention.

First, using the block diagram shown in FIG. 3, a description is given of a structure of an electronic device according to the second embodiment. The electronic device according to the second embodiment comprises a battery 301 that supplies power to a digital camera, a booster power supply unit 302 that converts the voltage supplied by the battery 301 to the high voltage required to run a liquid crystal backlight and the like, and a controller 304 that controls the entire digital camera system 303. Moreover, the second embodiment comprises operating switches 308 that detect operation by a user, a battery voltage detector 306 that measures battery voltage, and a constant current load unit 305 that holds a load switching unit load current at a constant value. The second embodiment further comprises a load voltage detector 316 that measures a load voltage and a remaining charge display unit 307 that displays a replace-battery sign.

As a controller, the electronic device according to the second embodiment has a switch state detector 309 that detects the state of the operating switches 308 and outputs switch state information, and a power supply control unit 310 that outputs ON/OFF signals to the booster power supply unit 302 in response to the switch state information.

In addition, the electronic device according to the second embodiment comprises an A/D converter 312 that converts analog signals from the battery voltage detector 306 and the load voltage detector 316 into digital signals, a coefficient recording unit 313 that stores coefficients used in calculating the remaining battery charge, and a load power control unit 315 that switches the load power.

The electronic device according to the second embodiment further comprises a constant current load control unit 311 that determines from the switch state information whether or not to switch loads, and if required operates the constant current load unit 305, the load power control unit 315, a remaining charge calculator 314 and the A/D converter 312. The remaining charge calculator 314 determines whether or not an operation input by the operating switches 308 is feasible from the present battery voltage information V0 obtained from the A/D converter 312, the digitally converted battery voltage information V1, the coefficients recorded in the coefficient recording unit 313 and a load power selection signal.

Figure 4:
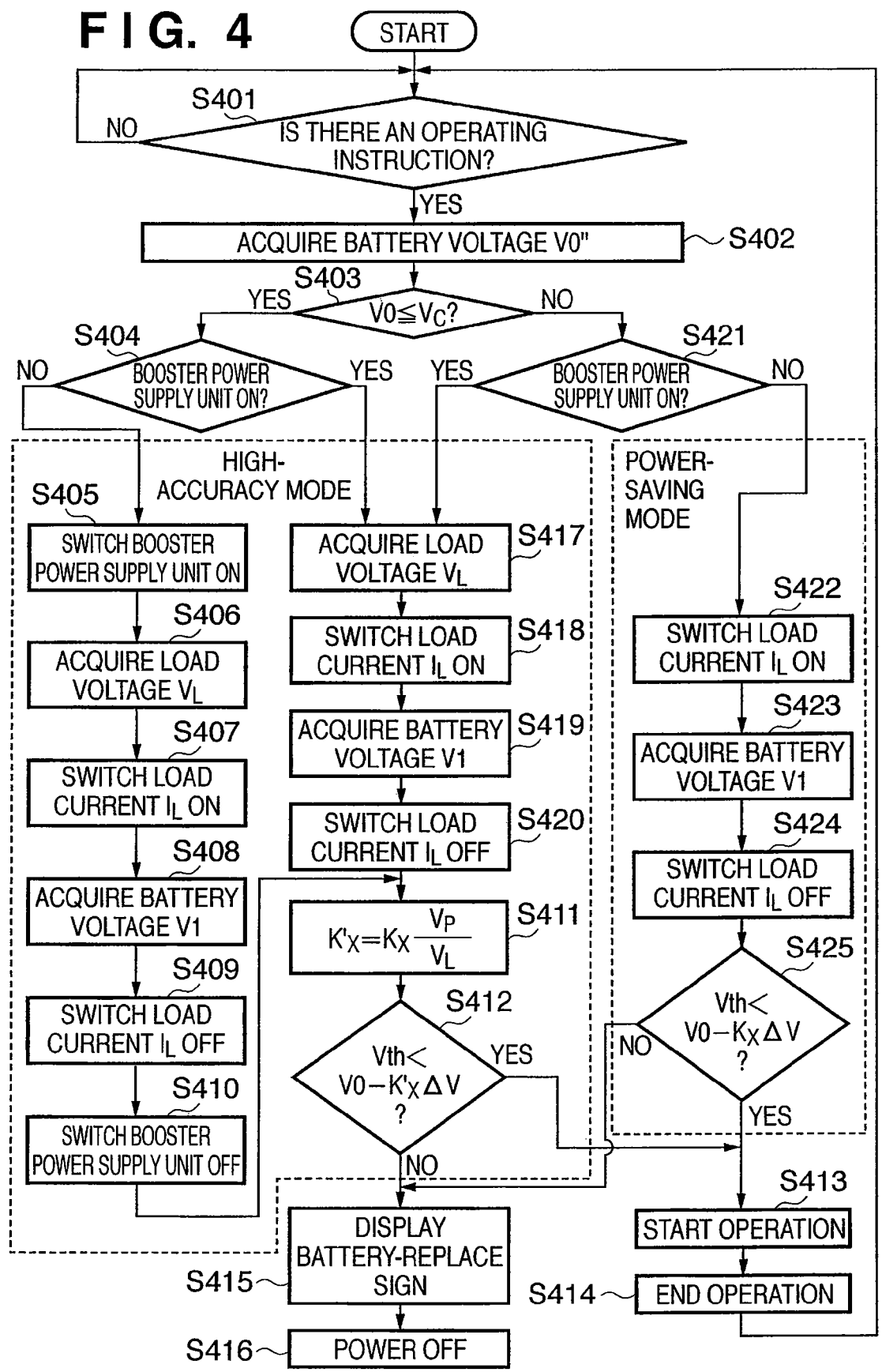
FIG. 4 is a flow chart illustrating processing performed by the electronic device according to the second embodiment of the present invention.

Next, a description is given of the operation of the second embodiment using the flow chart shown in FIG. 4.

The camera stands by until a camera operating instruction is input from the operating switches 308 (step S401). Then, once a camera operating instruction is input using the operating switches 308, the digital camera system 303, through the battery voltage detector 306, acquires present battery voltage information V0 digitally converted by the A/D converter 312 (step S402).

Next, it is determined whether or not the present battery voltage information V0 is equal to or less than a high-accuracy mode threshold value $V_C$ (step S403). If the results of this determination indicate that the battery voltage information V0 is equal to or less than the high-accuracy mode threshold value $V_C$, the process proceeds to step S404 and it is determined whether or not the booster power supply unit 302 is already ON.

If the results of the determination made in step S404 indicate that the booster power supply unit 302 is not ON, the load power control unit 315 switches the booster power supply unit 302ON (step S405). Next, the digital camera system 303 gets a load voltage detection signal from the connection between a first resistor 316a and a second resistor 316b that comprise the load voltage detector 316, supplies the signal to the A/D converter 312 for digital conversion, and acquires load voltage information $V_L$ (step S406).

Next, the constant current load control unit 311 switches the constant current load unit 305 ON, outputting a predetermined load current $I_L$ from the output of the booster power supply unit 302 (step S407). Then, the battery voltage at this time is digitally converted at the A/D converter 312 and battery voltage information V1 acquired (step S408).

After acquiring the battery voltage information V1 in step S408, the constant current load control unit 311 switches the constant current load unit 305 OFF (step S409) and the load power control unit 315 shuts the booster power supply unit 302 OFF (step S410). Next, as in the first embodiment, the remaining charge calculator 314 carries out the following calculation process and comparison using equations (3) to (5) (steps S411, 412):

$$K'_X = K_X \cdot \frac{V_P}{V_L} \qquad (3)$$

$$Vth < V0 - K'_x \Delta V \qquad (4)$$

$$\Delta V = V0 - V1 \qquad (5)$$

If as a result of the foregoing calculation process and comparison at the remaining charge calculator 314 (step S412) it is determined that the calculation process results are greater than the lower limit threshold voltage Vth, it is determined that the operation input in step S401 can be executed and operation starts (step S413). Next, once the desired operation is finished, the operation is ended (step S414).

If as a result of the foregoing calculation process and comparison (step S412) it is determined that the calculation process results are equal to or less than the lower limit threshold voltage Vth, then it is determined that the operation input in step S401 cannot be executed and a replace-battery sign is displayed on the remaining charge display unit 307 (step S415). Then, the power supply control unit 310 switches the booster power supply unit 302 OFF (step S416).

By contrast, if the results of the determination made in step S404 indicate that the booster power supply unit 302 is ON, then only the actions of switching the booster power supply unit 302 ON/OFF (steps S405, 410) are eliminated from steps S405-410, measuring the $V_L$ (step S417), switching the constant current load unit 305 ON (step S418), acquiring the V1 (step S419), and switching the constant current load unit 305 OFF (step S420) are executed, and the process shifts to step S411. Processing from step S411 and thereafter is the same as that described above.

In addition, if the results of the determination made in step S403 indicate that the present battery voltage information V0 is greater than a high-accuracy mode threshold value $V_C$, the camera shifts to a power saving mode. Here, it is determined whether or not the booster power supply unit 302 is already ON (step S421). If the results of this determination indicate that the booster power supply unit 302 is ON, the camera shifts once more to the high-accuracy mode because it cannot enter the power saving mode and follows the processing of from step S417 and thereafter described above. In addition, if the booster power supply unit 302 is not ON, then as in the conventional example the camera switches the constant current load unit 305ON (step S422), acquires V1 (step S423), and switches the constant current load unit 305 OFF (step S424). Then, after executing these steps, a calculation process and comparison using the following equations (6) and (7) (step S425) are carried out. The operations of from step S425 onward are the same as those of steps S413 to 415.

$$Vth < V0 - Kx \Delta V \qquad (6)$$

$$\Delta V = V0 - V1 \qquad (7)$$

The second embodiment, because it connects the constant current load unit 305 to the booster power supply unit 302 output, like the first embodiment can prevent a decline in remaining charge detection accuracy as the load power falls when the remaining battery charge is low.

In addition, as the remaining battery charge declines and the battery voltage falls, the booster power supply unit 302 is switched ON and connected to the constant current load unit 305, and therefore the load power can be increased so as to enable more accurate calculation of the remaining battery charge.

In addition, from the booster power supply unit 302 connected to the constant current load unit 305 the actual output voltage at the time the remaining charge is calculated is acquired and reflected in the remaining battery charge calculation, which enables the remaining battery charge to be calculated with greater accuracy. Moreover, the present embodiment is constructed so as to take advantage of the characteristics of a booster power supply unit 302, that is, the fact that when ON a preset boosted voltage is output and when OFF the battery voltage is output, and switch the load power, and therefore, an arrangement that makes it possible to achieve high-accuracy remaining charge calculation as well as energy saving is realized using a simple structure with no load switching means.

Third Embodiment

A description will now be given of a third embodiment of the present invention, while referring to FIG. 5 and FIG. 6.

Figure 5:
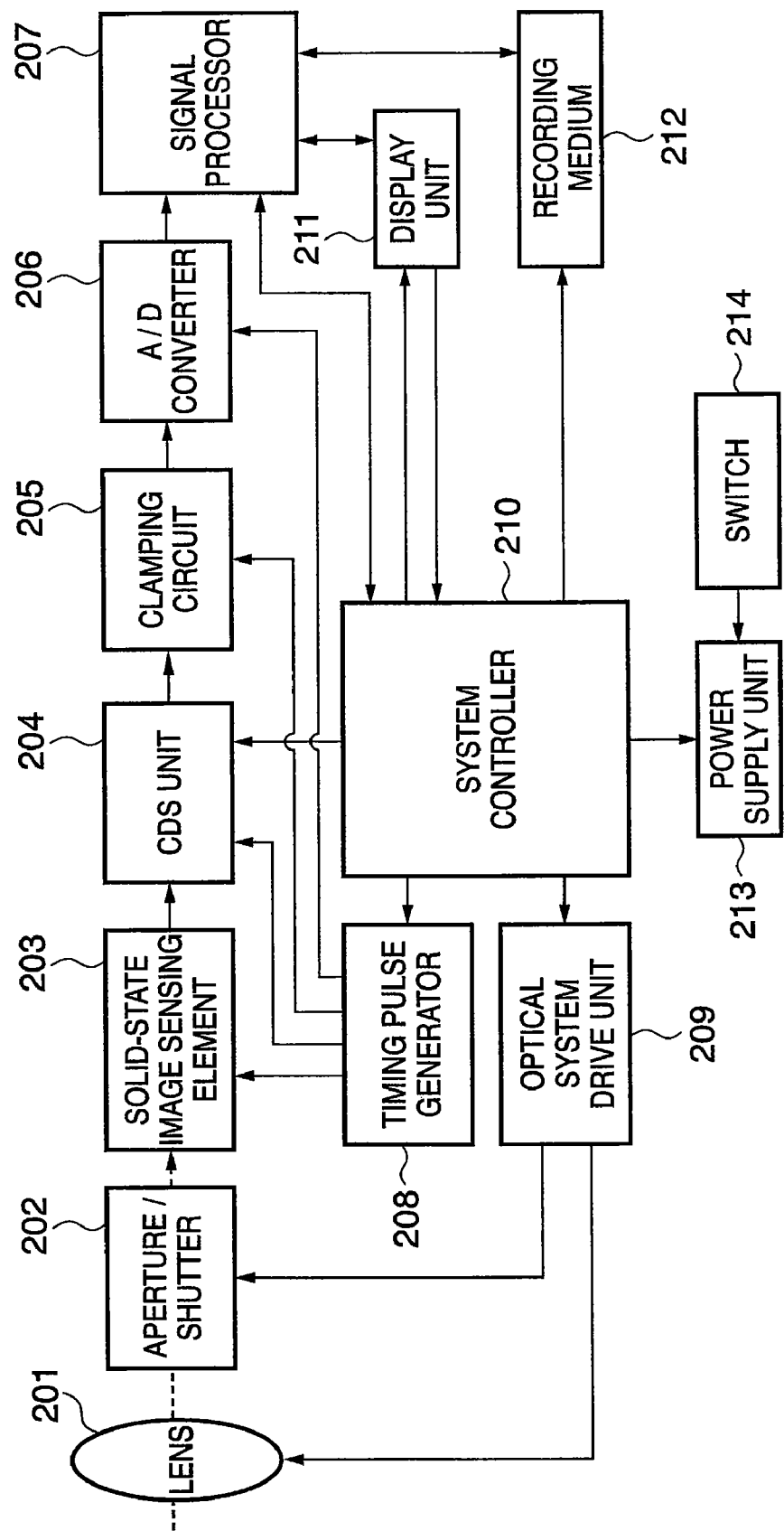
FIG. 5 is a block diagram illustrating the functional blocks of a digital camera a third embodiment of the present invention.

The structure of a digital camera of the third embodiment is shown in FIG. 5. In FIG. 5, reference numeral 201 designates a lens that focuses the optical image of a photographic subject onto a solid-state image sensing element 203. Reference numeral 202 designates an aperture/shutter that has a shutter function and combines it with an aperture that controls the amount of light passing through the lens 201. Reference numeral 203 designates the solid-state image sensing element that converts the optical image of the photographic subject focused by the lens 201 into electrical signals.

Reference numeral 204 designates a CDS unit that carries out correlated double sampling in order to remove the clock and reduce the noise of the electrical signals that are output by the solid-state image sensing element 203. Reference numeral 205 designates a clamping circuit that clamps the output signals of the CDS unit 204 at a predetermined reference voltage at the timing of a clamping pulse that is supplied from a timing pulse generator 208 that is described below. Reference numeral 206 designates an A/D converter that converts the clamp output signals from analog signals to digital signals. Reference numeral 207 designates a signal processor that performs various types of signal processing and conversion so that the signals are in a desired format for display, recording and so forth.

Reference numeral 208 designates the timing pulse generator that generates the necessary pulses for the solid-state image sensing element 203, CDS unit 204, clamping circuit 205 and A/D converter 206. Reference numeral 209 designates an optical system drive unit for driving the lens 201 and the aperture/shutter 202. Reference numeral 210 designates a system controller that controls the entire image sensing apparatus and performs a variety of calculations, 211 designates a display unit that receives signals from the signal processor 207 and displays them on an LCD or the like, and 212 designates a recording medium such as a semiconductor memory or the like for recording and outputting image data. Reference numeral 213 designates a power supply unit that supplies power to all blocks of the digital camera and 214 designates a switch for switching the digital camera power ON and OFF.

Figure 6:
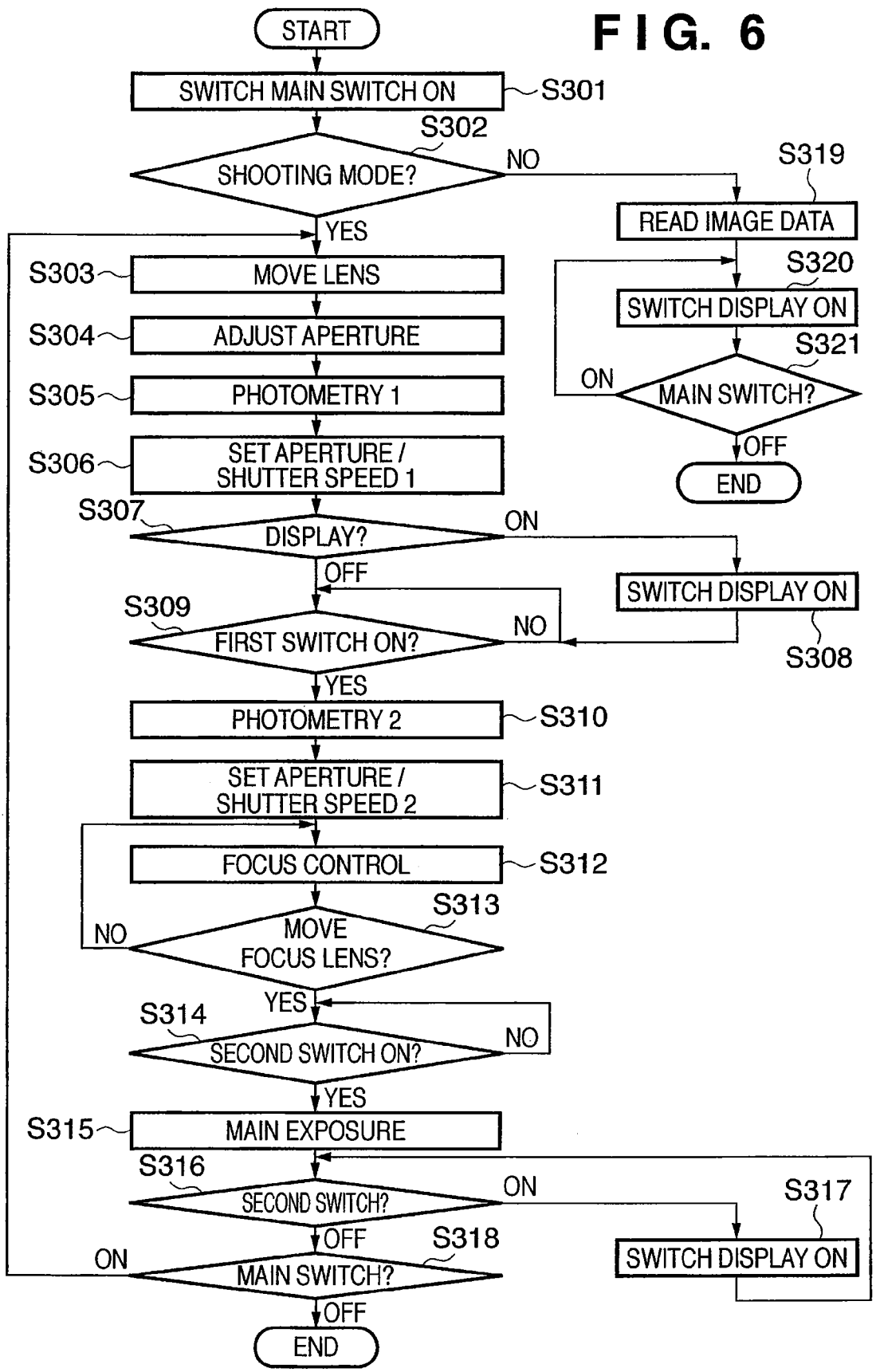
FIG. 6 is a flow chart illustrating the basic operation of the digital camera according to the third embodiment of the present invention.

Next, a brief description is given of the basic operation of the digital camera of the third embodiment, using the flow chart shown in FIG. 6.

The image sensing apparatus, once the main switch 214 is switched ON (step S301), starts to operate the power supply unit 213 and supplies power to the main power supply and control system.

Next, it is determined whether or not the operating mode of the image sensing apparatus is shooting mode or playback mode (step S302). If the results of this determination indicate that the image sensing apparatus is in the shooting mode, then the image sensing apparatus enters an image sensing sequence. If the results of the determination made in step S302 indicate that the image sensing apparatus is in the playback mode, then the image sensing apparatus enters a playback sequence and data is temporarily output from the recording medium 212 to the signal processor 207 (step S319), the data is processed for display, and then an image is displayed on the LCD or the like (step S320). Thereafter, the image is displayed until the main switch 214 is switched OFF. When the main switch is switched OFF (step S321), display of the image is terminated and the power is switched OFF.

If the results of the determination made in step S302 indicate that the image sensing apparatus is in the shooting mode, the AF lens is driven to a reset position (step S303) and power to the image sensing system circuitry, such as the solid-state image sensing element 203 and the timing pulse generator 208, is switched ON.

Next, the system controller 210 adjusts the aperture/shutter 202 using signals from the optical system drive unit 209 (step S304). This control begins with a photometry sequence initiated after the aperture/shutter 202 is released.

In the photometry sequence, signals output from the solid-state image sensing element 203 are subjected to correlated double sampling at the CDS unit 204, the OB (optical black) portion clamped at the clamping circuit 205, and A/D converted at the A/D converter 206. This converted image data is then processed at the signal processor 207 and then further input to the system controller 210, where an exposure control value is calculated from the photometric value (step S305).

In accordance with the calculation results, the system controller 210 determines the aperture setting and shutter speed (step S306) according to a locus programmed in advance. The display mode is checked (step S307). If the results of the check of the display mode in step S307 indicate that the image sensing apparatus is in a display ON mode, a display is performed using the display unit 211 (step S308). Thereafter the process proceeds to step S309.

If the image sensing apparatus is not in the display ON mode, the process proceeds to step S309 and the apparatus stands by until a first switch of the release switch is switched ON. In step S309, the once the first switch is switched ON, the photometry sequence is started and photometry and calculation are once again performed (step S310). Then, in accordance with the results, the system controller 210 once again determines the aperture setting and shutter speed (step S311) according to the locus programmed in advance.

Next, at the signal processor 207 the high-frequency component is extracted from the signals that have pass through the solid-state image sensing element 203, the CDS unit 204, the clamping circuit 205 and the A/D converter 206 and a calculation of the focus state of the photographic subject is performed at the system controller 210 (step S312). Thereafter, the lens is moved and it is determined whether or not the subject is in focus (step S313). If the results of the determination made in step S313 indicate that the subject is not in focus, the process returns to step S312, the lens moved, and the focus state is once again calculated.

If the results of the determination made in step S313 indicate that the subject is in focus, then in step S314 the image sensing apparatus stands by until a second switch of the release switch is switched ON. Then, when the second switch is switched ON, the process proceeds to step S315 and a still image is captured and attendant processing performed. Specifically, once exposure is finished, image data that is obtained through the solid-state image sensing element 203, the CDS unit 204, the clamping circuit 205 and the A/D converter 206 is subjected to desired signal processing at the signal processor 207 and recorded in the semiconductor memory or other such recording medium 212 by operation of the system controller 210.

Next, the process proceeds to step S316 and it is determined whether or not the second switch continues to be pressed (ON). If the results of this determination indicate that the second switch continues to be pressed, the process proceeds to step S317 and the image is displayed on the LCD. This display continues until the second switch is switched OFF, whereupon display is terminated and image sensing is ended. By contrast, If the results of the determination made in step S316 indicate that the second switch is OFF, image sensing is ended without carrying out display.

Next, the process proceeds to step S318 and it is determined whether or not the main switch is OFF. If the results of this determination indicate that the main switch is not switched OFF, then the process returns to step S303, the sequence up to when the first switch is pressed is repeated, and the image sensing apparatus stands by until the first switch is switched ON. If the results of the determination made in step S318 indicate that the main switch is OFF, each mechanical component of the optical block returns to a predetermined position and the power is switched off.

A description will now be given of the operation of the digital camera of the third embodiment, using the block diagram shown in FIG. 7 and the flow chart shown in FIG. 8.

Figure 7:
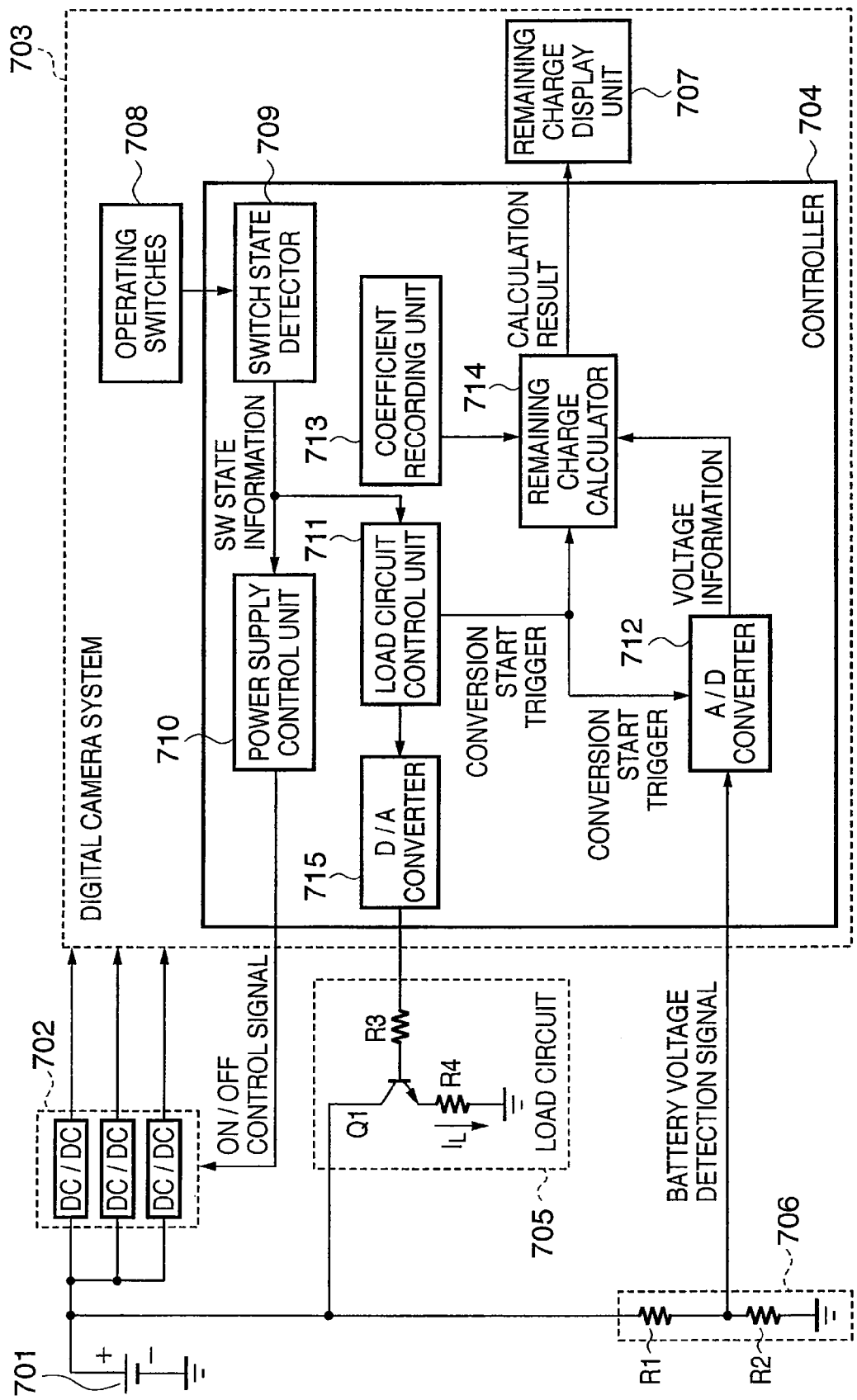
FIG. 7 is a block diagram illustrating an example of the structure of the digital camera according to the third embodiment of the present invention.

In FIG. 7, a battery voltage detector 706 is connected to a battery 701. A load circuit 705 is connected in parallel to the battery voltage detector 706. The battery voltage detector 706 comprises voltage-dividing resistors R1, R2 serially connected. The load circuit 705 comprises a transistor Q1 and resistors R3, R4. The load circuit 705 is constructed so that a current $I_L$ is determined by the voltage output from a controller 704 to the resistor R3.

A power supply unit 702 supplies power to a digital camera system 703 by converting the voltage from the battery 701 into the multiple constant voltages required by the digital camera system 703. The controller 704 exercises overall control of the digital camera system 703. In FIG. 7 only the blocks pertaining to remaining battery charge estimation circuitry are shown.

A power supply control unit 710 controls the power supply unit 702, switching the voltage supplied from the power supply unit 702 as required by the operation of the digital camera and switching unneeded voltage OFF.

Operating switches 708 include a release switch, mode switch for selecting an operating mode and the like, for inputting operating instructions. The operating switches 708 are connected to a switch state detector 709 that monitors the state of the operating switches 708.

A load circuit control unit 711 determines the current $I_L$ that is output to the load circuit 705 according to the switch state information detected by the switch state detector 709, and transmits voltage information output to the resistor R3 of the load circuit 705 for outputting the current $I_L$ as digital signals to a D/A converter 715. The D/A converter 715 converts the digital signal voltage value information into analog voltage for output to the resistor R3 of the load circuit 705. A divided battery voltage detection signal is supplied to an A/D converter 712 by the battery voltage detector 706. The battery voltage information is then converted into digital values by the A/D converter 712.

A remaining charge calculator 714 provides an estimate of the remaining battery charge using the battery voltage information transmitted from the A/D converter 712 and coefficients stored in a coefficient recording unit 713. A remaining charge display unit 707 displays the remaining battery charge estimation results as calculated by the remaining charge calculator 714.

Figure 8:
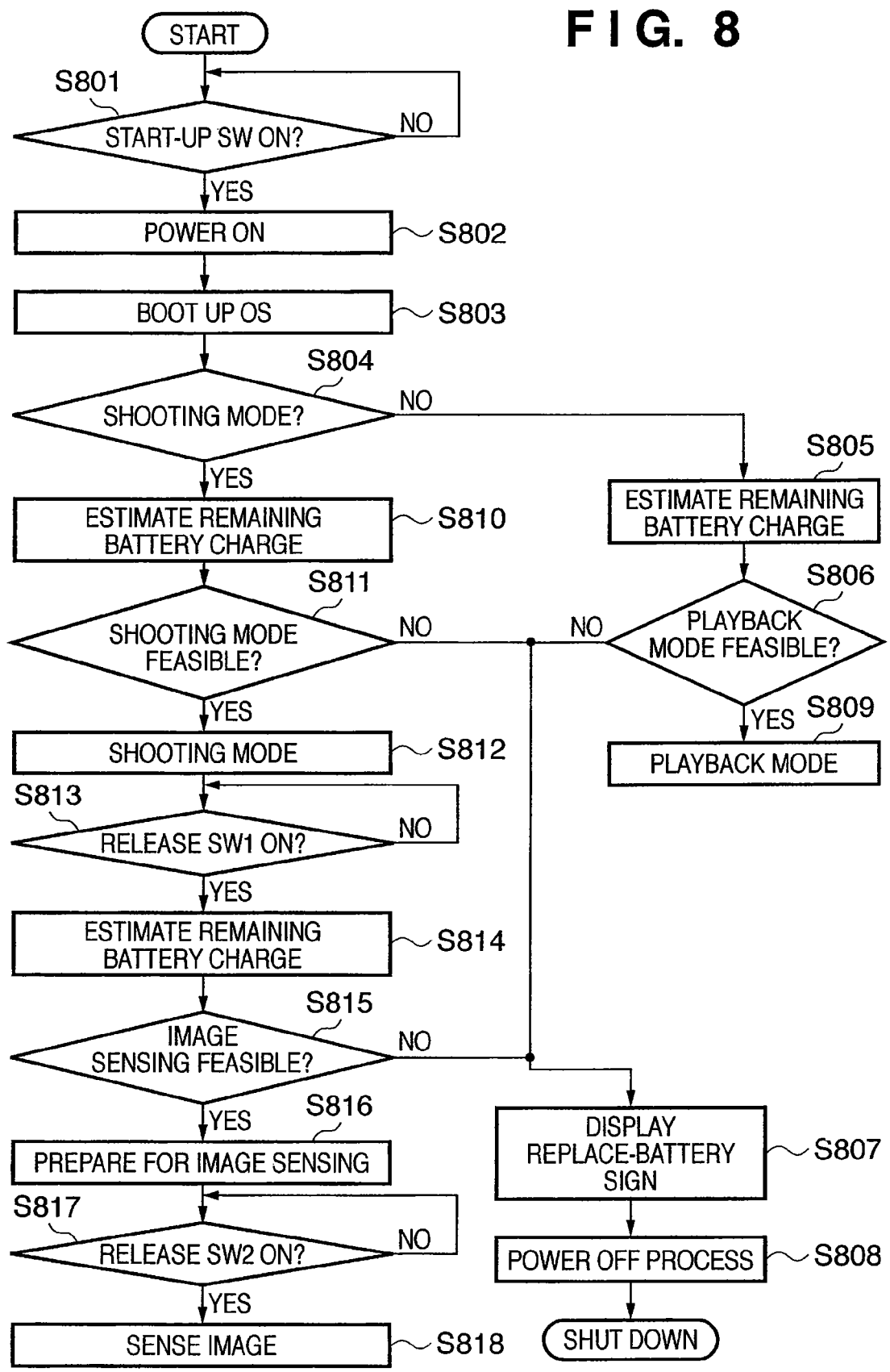
FIG. 8 is a flow chart illustrating the operation of the digital camera according to the third embodiment of the present invention.

Next, a description is given of the operation of the third embodiment, with reference to the flow chart shown in FIG. 8.

Once operation is started, it is determined whether or not a start-up switch included in the operating switches 708 is ON (step S801). If the results of the determination made in step S801 indicate that the start-up switch is ON, the switch state detector 709 detects a start-up command and the power supply unit 702 is switched ON by the power supply control unit 710 (step S802).

Once the power supply unit 702 is switched ON in step S802, the OS that is the minimum requirement for activating the digital camera system 703 is booted up (step S803). Next, the process proceeds to step S804 and the switch state detector 709 determines from the state of the operating switches 708 whether the start-up is activation in the shooting mode or activation in the playback mode. If the results of this determination indicate that the start-up is activation in the playback mode, a remaining battery charge estimate is performed in order to estimate whether or not start-up in the playback mode is feasible with the present remaining battery charge (step S805). A detailed description of the remaining battery charge estimate is given later using the flow chart shown in FIG. 9.

Next, the results of the remaining battery charge estimate are analyzed (step S806). If it is determined that start-up in the playback mode is not feasible, the process proceeds to step S807 and a replace-battery sign is displayed on the remaining charge display unit 707. Next, the power supply control unit 710 switches the power supply unit 702 OFF (step S808) and puts the camera in a shutdown state. If the results of the determination made in step S806 indicate that start-up in the playback mode is feasible, then the digital camera system 703 is activated in the playback mode (step S809).

By contrast, if the results of the determination made in step S804 indicate that the start-up is activation in the shooting mode, the process proceeds to step S810 and a remaining battery charge estimate is performed in order to estimate whether or not activation in the shooting mode is feasible with the present remaining battery charge.

Next, the process proceeds to step S811 and the results of the remaining battery charge estimate are analyzed. If it is determined that start-up in the shooting mode is not feasible, then a replace-battery sign is displayed on the remaining charge display unit 707 (step S807). Next, the power supply control unit 710 switches the power supply unit 702 OFF (step S808) and puts the camera in a shutdown state.

On the other hand, if the results of the analysis made in step S811 indicate that start-up in the shooting mode is feasible, then the digital camera system 703 is activated in the shooting mode (step S812). Next, the process proceeds to step S813 and the camera stands by in the shooting mode until the first switch of the operating switches 708 is pressed.

Once the first switch is pressed in step S813, the process proceeds to step S814 and a remaining battery charge estimation is performed in order to estimate whether or not image sensing is feasible with the present remaining battery charge.

Next, the results of the remaining battery charge estimation are analyzed (step S815). If the results of this analysis indicate that image sensing is not feasible, a replace-battery sign is displayed on the remaining charge display unit 707 (step S807). Next, the power supply control unit 710 switches the power supply unit 702 OFF (step S808) and puts the camera in a shutdown state.

By contrast, if the results of the analysis of step S815 indicate that image sensing is feasible, the process proceeds to step S816 and preparations for image sensing are carried out. As described using FIG. 6, these preparations include such processes as determining the aperture setting and shutter speed, moving the lens to bring the photographic subject into focus, and so forth.

Next, in step S817, the camera stands by until the second switch of the release switch included in the operating switches 708 is pressed. Then, once the second switch is pressed, the process proceeds to step S818 and image sensing is carried out.

Figure 9:
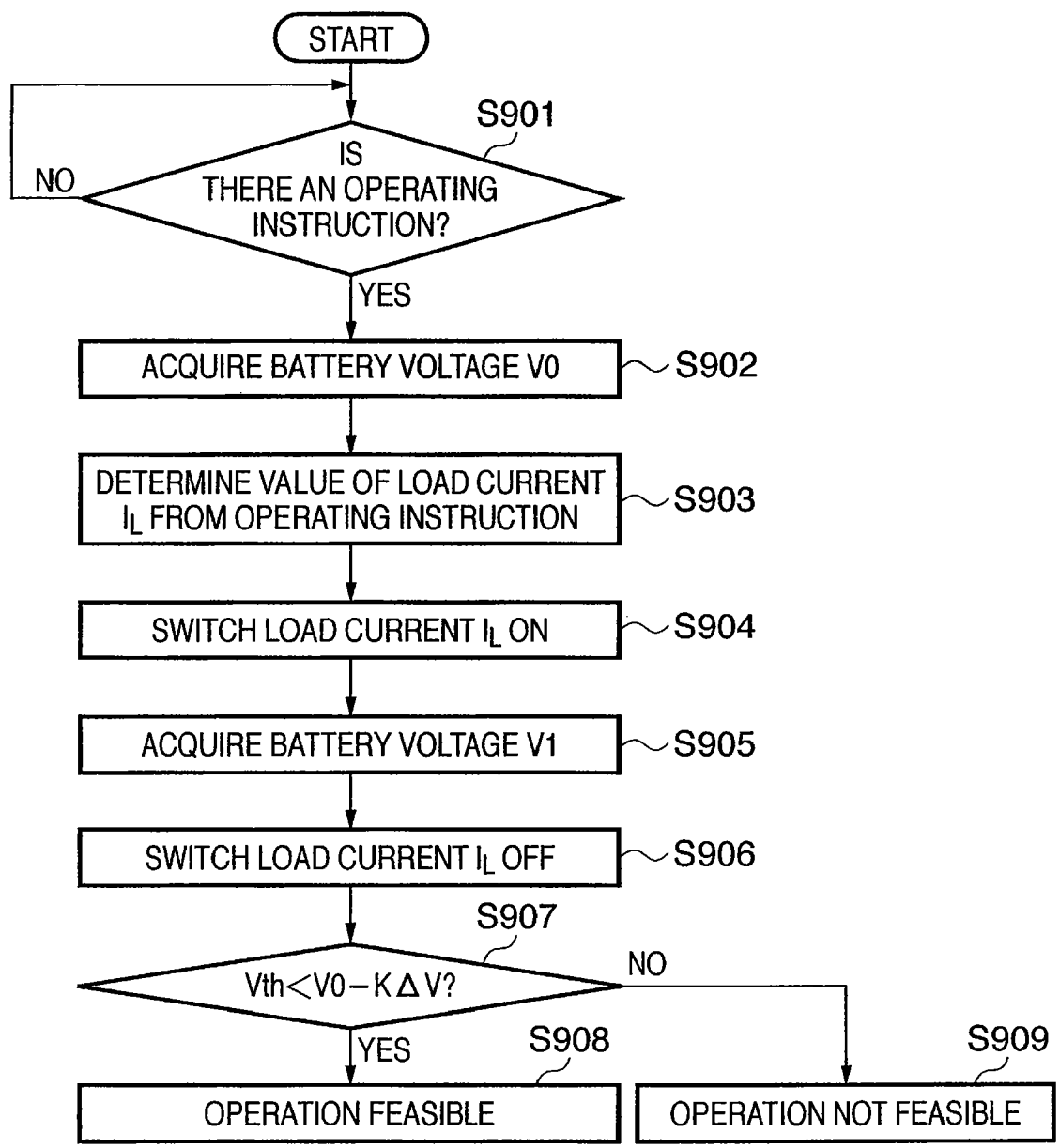
FIG. 9 is a flow chart illustrating a remaining battery charge estimation procedure according to the third embodiment of the present invention.

Next, a detailed description is given of remaining battery charge estimation, using the flow chart shown in FIG. 9.

First, in step S901, the image sensing apparatus stands by, awaiting input of operating instructions from the switch state detector 709. Then, once an operating instruction is input, the load circuit control unit 711 first obtains the present voltage V0 of the battery 701 using the A/D converter 712 (step S902).

Next, from the content of the operating instructions the load circuit control unit 711 determines the current $I_L$ to be output to the load circuit 705 (step S903). Specifically, in the remaining battery charge estimation of step S805, the load circuit control unit 711 sets the current $I_L$ in response to an operating instruction to start up in the playback mode. In the remaining battery charge estimation of step S810, the load circuit control unit 711 sets the current $I_L$ in response to an operating instruction to start up in the shooting mode. Similarly, in the remaining battery charge estimation of step S814, the load circuit control unit 711 sets the current $I_L$ in response to the operating instruction to execute an image sensing operation. Next, the load circuit control unit 711 releases a current $I_L$ to the load circuit 705 by applying voltage across the resistor R3 of the load circuit 705 through the D/A converter 715 (step S904). Then, after waiting a certain period of time until the load circuit 705 current $I_L$ stabilizes, the load circuit control unit 711 uses the A/D converter 712 to acquire the voltage value V1 of the battery 701 when the current $I_L$ is flowing (step S905).

Next, after obtaining voltage value V1, the load circuit control unit 711 applies "0V" across the resistor R3 of the load circuit 705 through the D/A converter 715, which switches the load circuit 705 current $I_L$ OFF (step S906). At the remaining charge calculator 714 the following calculations (1) and (2) are carried out (step S907). These calculations use the acquired voltage value V0 and voltage value V1, a coefficient K stored in the coefficient recording unit 713 and set in advance in response to the content of the operating instruction described above or in response to the current $I_L$ that is output to the load circuit 705, and a voltage value Vth at which the digital camera system 703 can operate.

$$Vth < V0 - K\Delta V \quad (1)$$

$$\Delta V = V0 - V1 \quad (2)$$

When the foregoing condition (Vth<V0−KΔV) holds true, it is determined that the digital camera system 703 can operate (step S908). When the foregoing condition does not hold true, it is determined that the digital camera system 703 cannot operate (step S909).

Such a construction enables the third embodiment to vary the current that is output to the load circuit. As a result, when estimate remaining battery charge estimation accuracy is required the drop voltage ΔV can be increased by increasing the current that is output to the load circuit, which has the advantage of enabling estimation accuracy to be improved.

Fourth Embodiment

Next, a description will be given of a fourth embodiment.

The structure of the fourth embodiment differs from the structure of the third embodiment in that the controller 704 is different. The operation of the fourth embodiment is the same as that of the third embodiment, and therefore, using FIG. 10, a description is given only of that structure which differs from that of the third embodiment.

Figure 10:
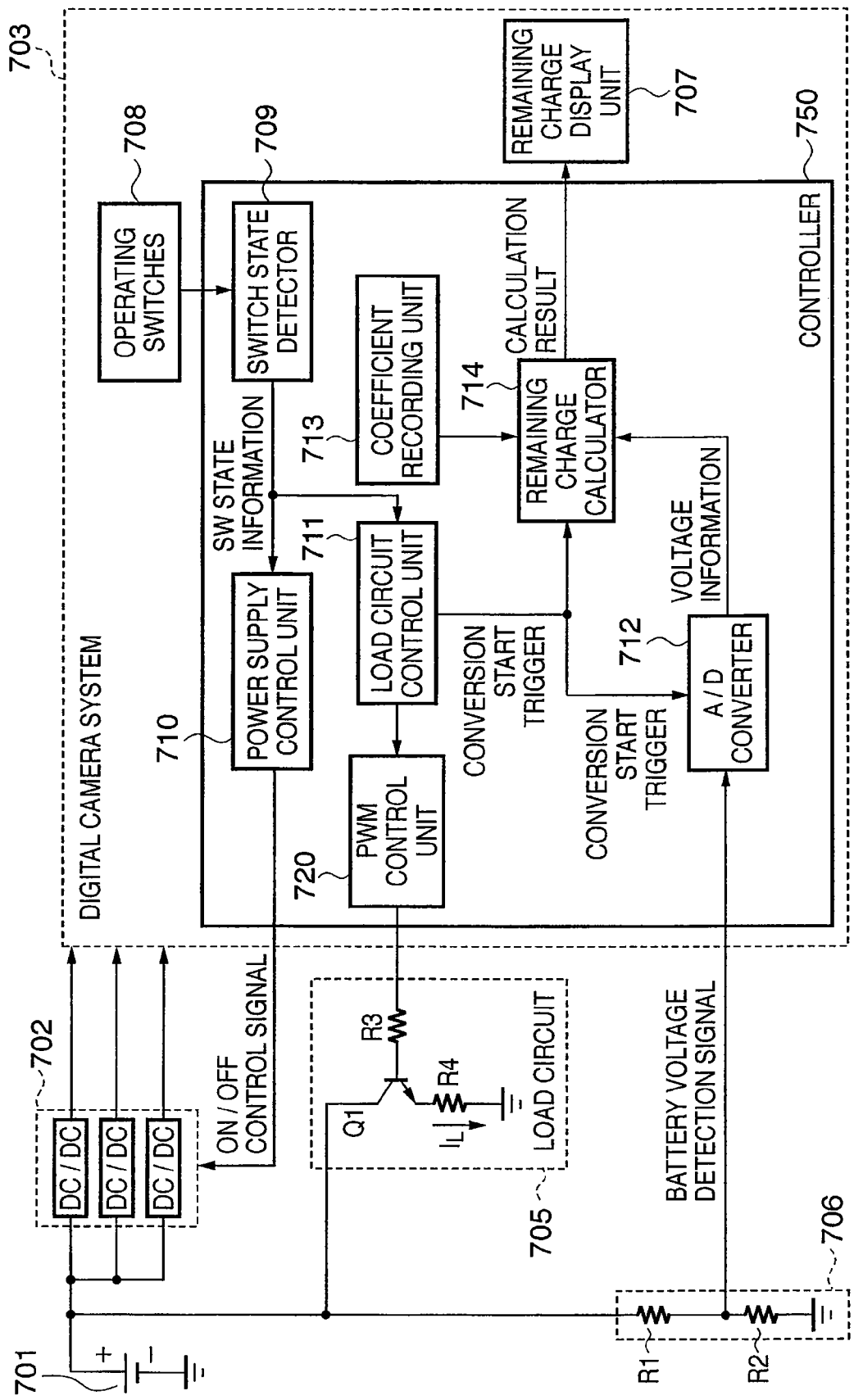
FIG. 10 is a block diagram illustrating an example of the structure of the electronic device according to a fourth embodiment of the present invention.

As shown in FIG. 10, a controller 750 is constructed so as to control the current $I_L$ that is output to the load circuit 705 by causing the load circuit control unit 711 to apply voltage across the resistor R3 of the load circuit 705 through a PWM control unit 720.

Specifically, the load circuit control unit 711 determines the current $I_L$ that is output to the load circuit 705 according to the switch state information detected by the switch state detector 709 and transmits information on the current $I_L$ to the PWM control unit 720. The PWM control unit 720 controls the current $I_L$ that is output to the load circuit 705 according to the pulse duty ratio.

The battery voltage detector 706 supplies the divided battery voltage detection signal to the A/D converter 712, and the battery voltage information is converted into a digital value by the A/D converter 712. The remaining charge calculator 714 makes a remaining battery charge estimate using the battery voltage information sent from the A/D converter 712 and the coefficients provided for each operating state stored in the coefficient recording unit 713. The remaining charge display unit 707 then displays the remaining battery charge estimation results as calculated by the remaining charge calculator 714.

Such a construction makes it possible to control the load circuit with the PWM, which is a digital circuit, and not with a mixed digital/analog circuit like the D/A converter, thereby enabling the system of the present invention to be implemented using smaller circuitry than that of the third embodiment.

Fifth Embodiment

The structure of a fifth embodiment of the present invention is the same as that of the third embodiment or the fourth embodiment. However, the fifth embodiment differs from these in that it performs a remaining battery charge estimation that determines the current $I_L$ that is output to the load circuit 705 on the basis of not only the operating instruction content but also the present battery voltage information V0.

Figure 11:
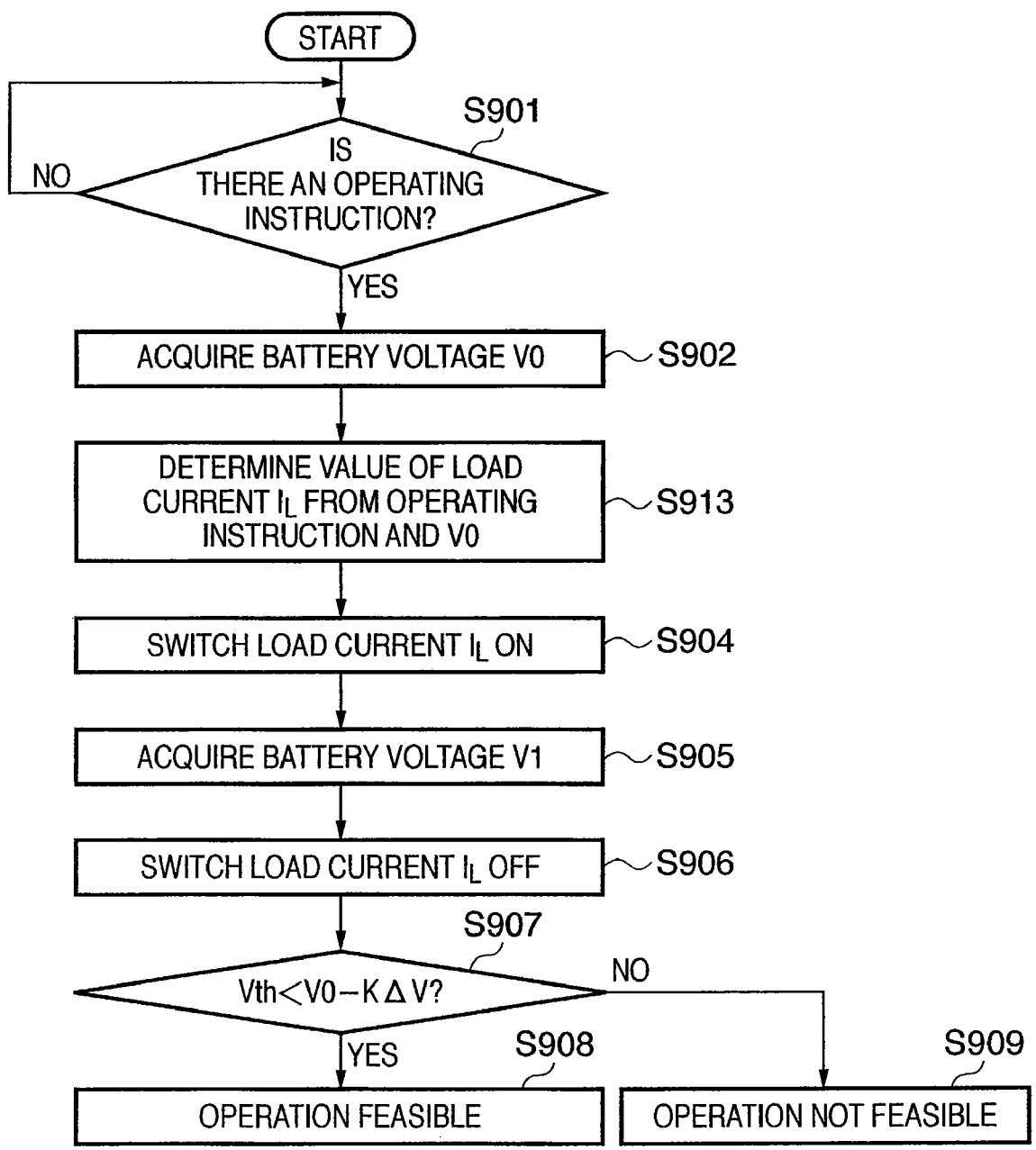
FIG. 11 is a flow chart illustrating the operation of the digital camera according to a fifth embodiment of the present invention.

Below, a description is given of the operation of estimating the remaining battery charge in the fifth embodiment, using FIG. 11. It should be noted that processes identical to those shown in FIG. 9 are given the same reference numerals.

In step S901, the image sensing apparatus stands by, awaiting input of operating instructions from the switch state detector 709 or the like. Then, once an operating instruction is input from the switch state detector 709, the process proceeds to step S902 and the load circuit control unit 711 first obtains the present voltage V0 the present battery 701 using the A/D converter 712.

Next, the process proceeds to step S913 and the load circuit control unit 711 determines the current $I_L$ that is output to the load circuit 705 from the operating instruction content and the present voltage value V0 of the battery 701. Next, the process proceeds to step S904 and the load circuit control unit 711 outputs current $I_L$ to the load circuit 705 by applying voltage across the resistor R3 of the load circuit 705 through the D/A converter 715.

Next, the process proceeds to step S905. After waiting a certain period of time until the load circuit 705 current $I_L$ stabilizes, the load circuit control unit 711 uses the A/D converter 712 to acquire the battery 701 voltage value V1 when the current $I_L$ is flowing.

Next, after obtaining voltage value V1 in step S905, the load circuit control unit 711 applies 0V across the resistor R3 of the load circuit 705 through the D/A converter 715, which switches the load circuit 705 current $I_L$ OFF (step S906).

Next, at the remaining charge calculator 714, the following calculations are carried out using the acquired voltage values V0 and V1, a coefficient K stored in the coefficient recording unit 713 and set in advance by the content of the operating instruction described above and by the current $I_L$ that is output to the load circuit 705, and a voltage value Vth at which the digital camera system 703 can operate (step S907).

$$Vth < V0 - K\Delta V \quad (1)$$

$$\Delta V = V0 - V1 \quad (2)$$

When the foregoing condition (Vth<V0−KΔV) holds true, it is determined that the digital camera system 703 can operate (step S908). When the foregoing condition does not hold true, it is determined that the digital camera system 703 cannot operate (step S909).

Such a construction enables the fifth embodiment to determine the current that is output to the load circuit 705 from the present battery 701 voltage value V0, and therefore, since the estimation accuracy can be low when the voltage value V0 is high (because the battery 701 remaining charge is clearly high), this arrangement has the advantage of enabling the amount of current output to the load circuit 705 to be reduced.

Sixth Embodiment

A description is now given of a sixth embodiment of the present invention. An example of the structure of a digital camera of the sixth embodiment is shown in the block diagram shown in FIG. 12. What follows is a description of the digital camera of this sixth embodiment.

A battery voltage detector 406 and a constant current load unit 405 capable of outputting a constant current are connected in parallel to a battery 401. The constant current load unit 405 is constructed so as to be susceptible to ON/OFF control.

Figure 12:
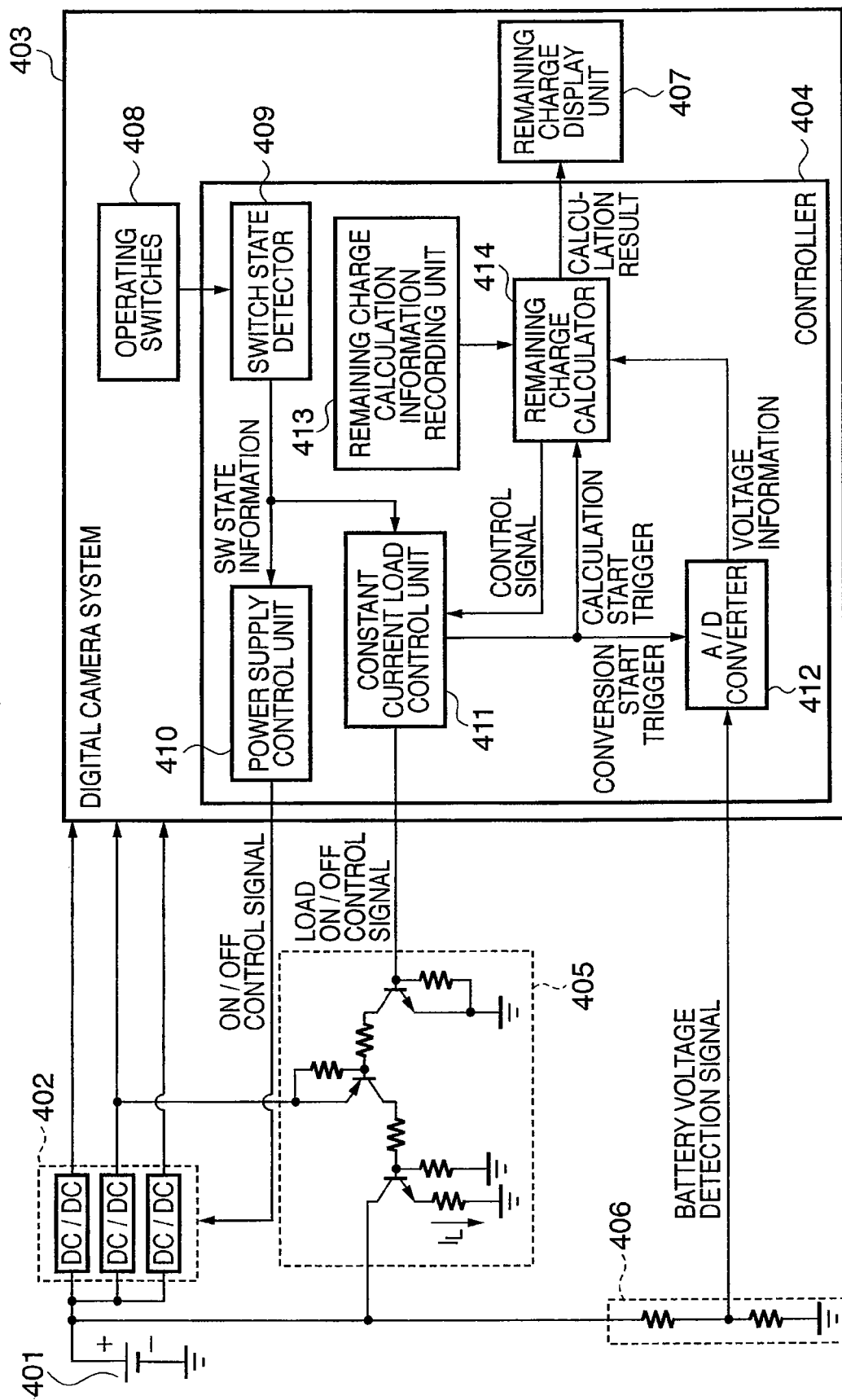
FIG. 12 is a block diagram illustrating an example of the structure of a digital camera according to a sixth embodiment of the present invention.

A power supply unit 402 that supplies power to a digital camera system 403 converts the voltage of the battery 401, generates multiple types of voltages required by the digital camera system 403, and supplies power. A controller 404 controls the digital camera system 403 as a whole. It should be noted that FIG. 12 shows only the blocks relating to the remaining battery charge estimation circuitry.

A power supply control unit 410 controls the power supply unit 402, switching ON the voltage supplied from the power supply unit 402 needed for the operation of the digital camera and switching OFF the voltage not needed.

Operating switches 408 include a release switch, a mode switch for selecting an operating mode and the like, for inputting operating instructions. A switch state detector 409 that monitors the state of the operating switches 408 is connected to the operating switches 408. A constant current load circuit control unit 411 switches the constant current load unit 405 ON/OFF in response to information relating to the switch state as detected by the switch state detector 409.

The battery voltage detector 406 causes a divided battery voltage detection signal to be supplied to an A/D converter 412, where the battery voltage information is converted into a digital value by the A/D converter 412.

A remaining charge calculator 414 then calculates the remaining battery charge using the battery voltage information supplied from the A/D converter 412 and reference values provided for each operating state and recorded in a remaining charge calculation information recording unit 413. A remaining charge display unit 407 displays the remaining battery charge estimation results calculated by the remaining charge calculator 414.

Figure 13:
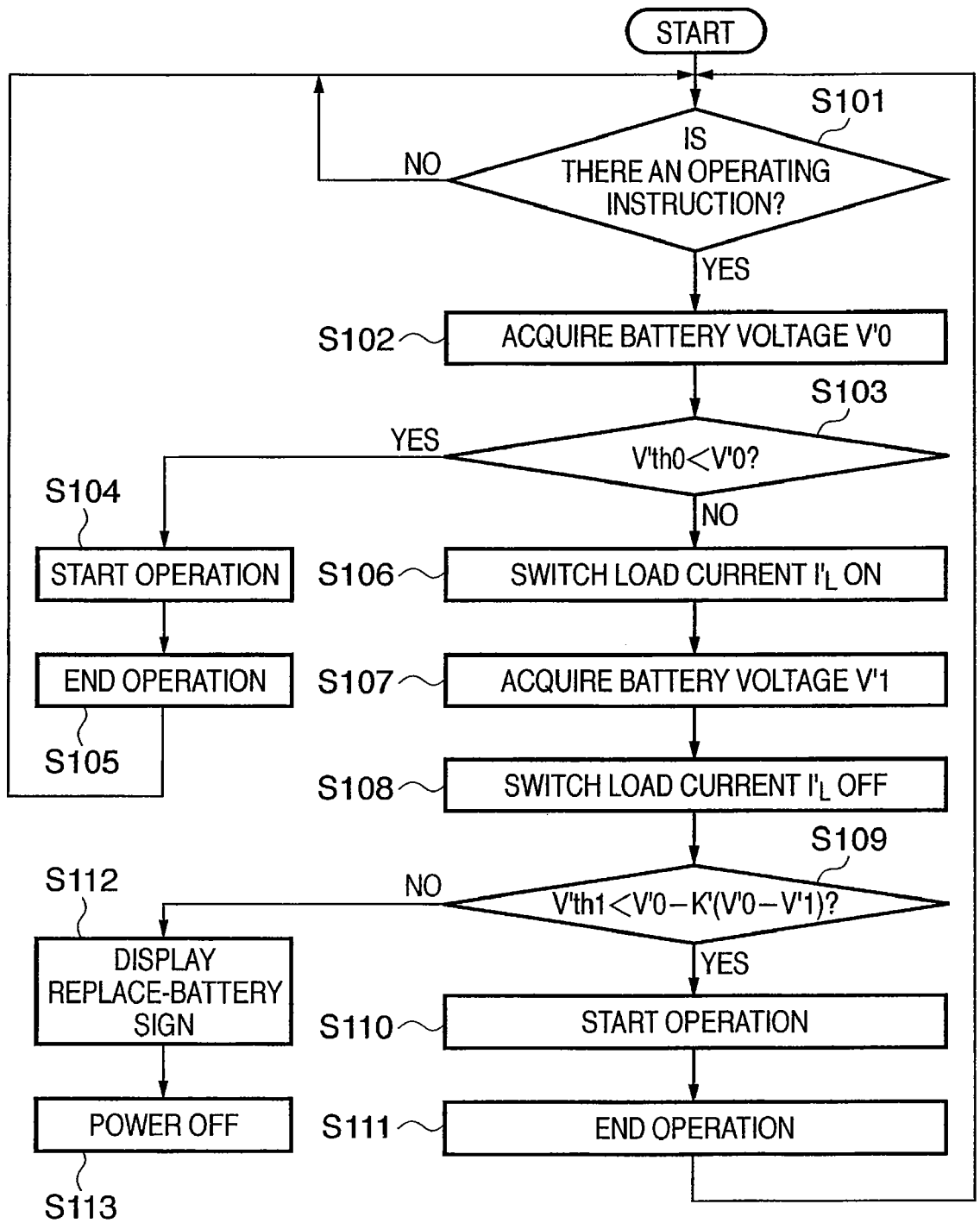
FIG. 13 is a flow chart illustrating the operation of the digital camera according to the sixth embodiment of the present invention.

Next, a description is given of the operation of the digital camera of the present embodiment, using the flow chart shown in FIG. 13.

First, the digital camera stands by, awaiting input of a camera operating instruction from the operating switches 408 (step S101). Then, once a camera operating instruction is input from the operating switches 408, the digital camera system 403, through the battery voltage detector 406, acquires the present battery voltage information V'0 digitally converted by the A/D converter 412 (step S102).

Next, after acquiring the battery voltage information V'0, the remaining charge calculator 414 carries out a comparison of the battery voltage information V'0 and a predetermined lower limit threshold voltage V'th0 at which a remaining battery charge estimation test to be described later is not conducted that is stored in the remaining charge calculation information recording unit 413 (step S103). If the results of the comparison performed in step S103 indicate that V'th0<V'0, then it is determined that the operation input in step S101 can be executed and camera operation corresponding to the camera operating instruction input from the operating switches 408 is started (step S104). When the desired operation is finished, operation is ended (step S105). Thereafter, the process returns to step S101 and the next input is awaited.

By contrast, if the results of the comparison conducted in step S103 indicate that V'th0≧V'0, the constant current load circuit control unit 411 switches the constant current load unit 405 ON, outputting a predetermined, desired load current I'$_L$ from the battery (step S106). Then, the constant current load circuit control unit 411 acquires battery voltage information V'1, which is the battery voltage at this time, digitally converted by the A/D converter 412 (step S107).

After the battery voltage information V'1 is acquired, the constant current load circuit control unit 411 switches the constant current load unit 405 OFF (step S108) and the remaining charge calculator 414 carries out the following calculation process and comparison (step S109):

$$V'th1 < V'0 - K'\Delta V' \quad (8)$$

$$\Delta V' = V'0 - V'1 \quad (9)$$

where V'th1 is a predetermined lower limit threshold voltage at which the camera can operate and K' is an arbitrary coefficient predetermined for each camera operation input using the operating switches 408, which is stored in the remaining charge calculation information recording unit 413.

If the results of the calculation process and comparison described above and carried out at the remaining charge calculator 414 (step S109) indicate that the calculation process results are greater than the lower limit threshold voltage V'th1 at which the camera can operate, then it is determined that the operation corresponding to the input in step S101 can be executed and operation is started (step S110). Once the desired operation is finished, operation is ended (step S111). Thereafter, the process returns to step S101 and the next input is awaited.

If the results of the calculation process and comparison described above in step S109 indicate that the calculation process results are equal to or less than the lower limit threshold voltage V'th1 at which the camera can operate, then it is determined that the operation corresponding to the input in step S101 cannot be executed and a replace-battery sign is displayed in the remaining charge display unit 407 (step S112). Next, the power supply control unit 410 switches the power supply unit 402 OFF (step S113).

It should be noted that the lower limit threshold voltage V'th0 at which the remaining battery charge estimation test is not carried out as well as the predetermined lower limit threshold voltage V'th1 at which camera operation is still possible may be changed with each type of camera operation.

In addition, these variables may be changed using the arbitrary coefficients K' predetermined in advance for each camera operation designated by the operating switches 408. For example, when carrying out a remaining battery charge estimation test for conducting an operation that uses a large amount of current, such as moving the lens barrel or charging the flash, the lower limit threshold K' may be made a large value. Moreover, the system may be operated in such a way that the lower limit threshold voltage V'th0 at which the remaining battery charge estimation test is not carried out as well as the predetermined lower limit threshold voltage V'th1 at which camera operation is still possible are increased. These variable reference values are also stored in the remaining charge calculation information recording unit 413.

The foregoing reduces the number of times the remaining battery charge estimation test is conducted prior to the execution of each operation, enabling power consumption to be reduced.

Seventh Embodiment

Figure 14:
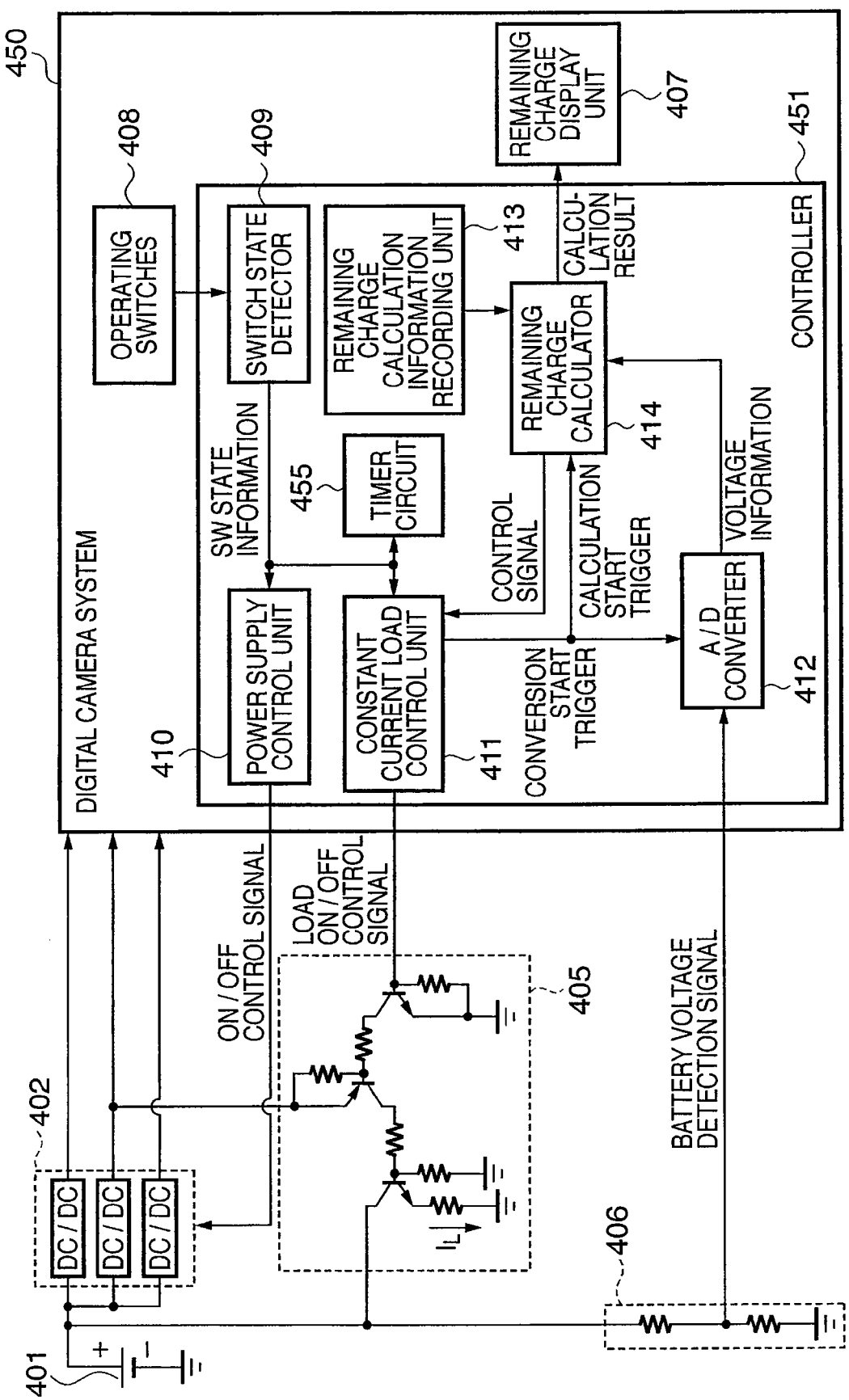
FIG. 14 is a block diagram illustrating an example of the structure of a digital camera according to a seventh embodiment of the present invention of the present invention.

A description is given below of a seventh embodiment of the present invention. A block diagram illustrating an example of the construction of a digital camera according to the seventh embodiment is shown in FIG. 14. The structure shown in FIG. 14 adds a timer circuit 455 to the structure shown in FIG. 12.

The timer circuit 415 counts the time from completion of one operation input using the operating switches 408 to input of a succeeding operation.

Figure 15:
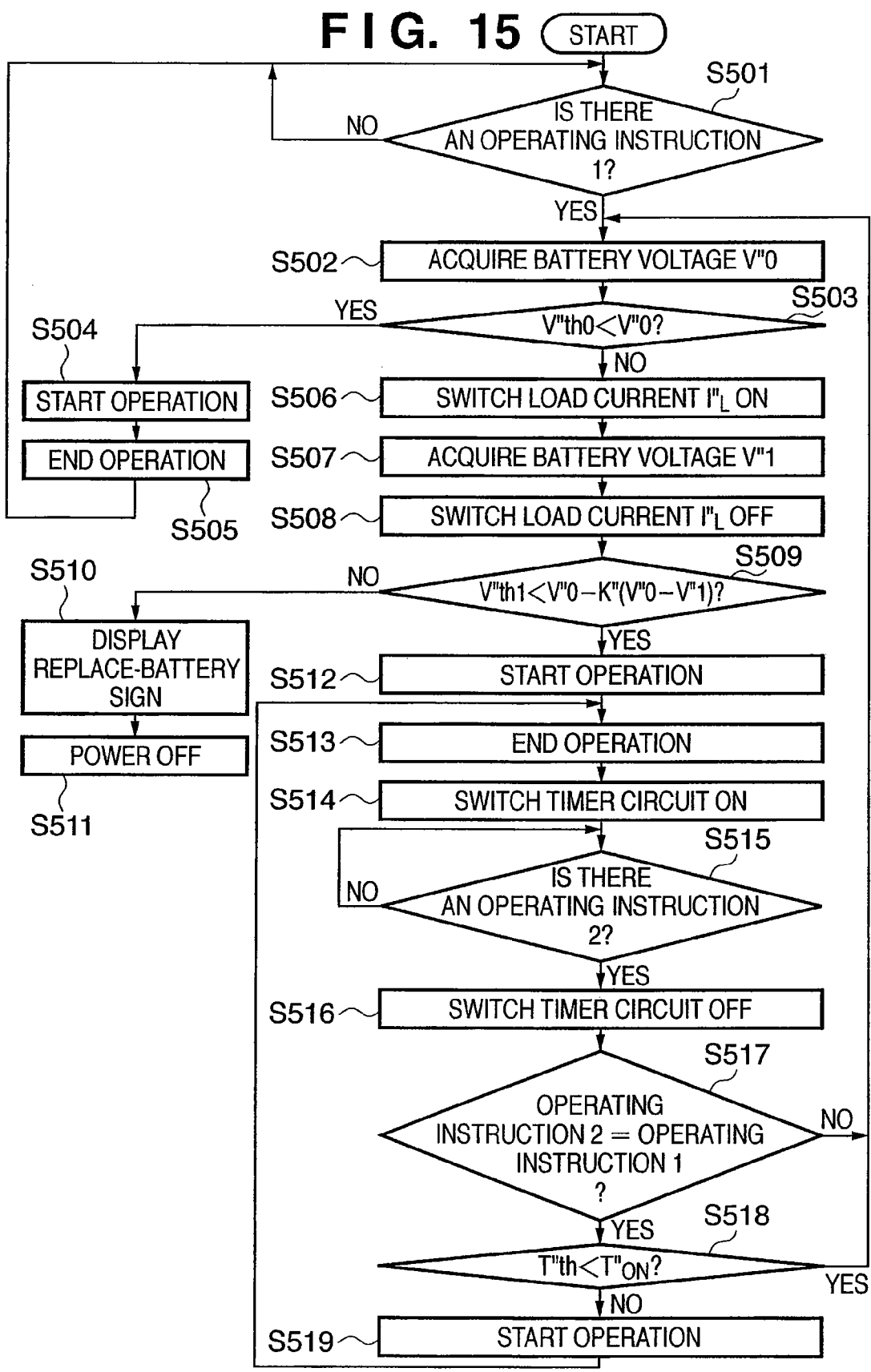
FIG. 15 is a flow chart illustrating the operation of the digital camera according to a seventh embodiment of the present invention.
Figure 16:
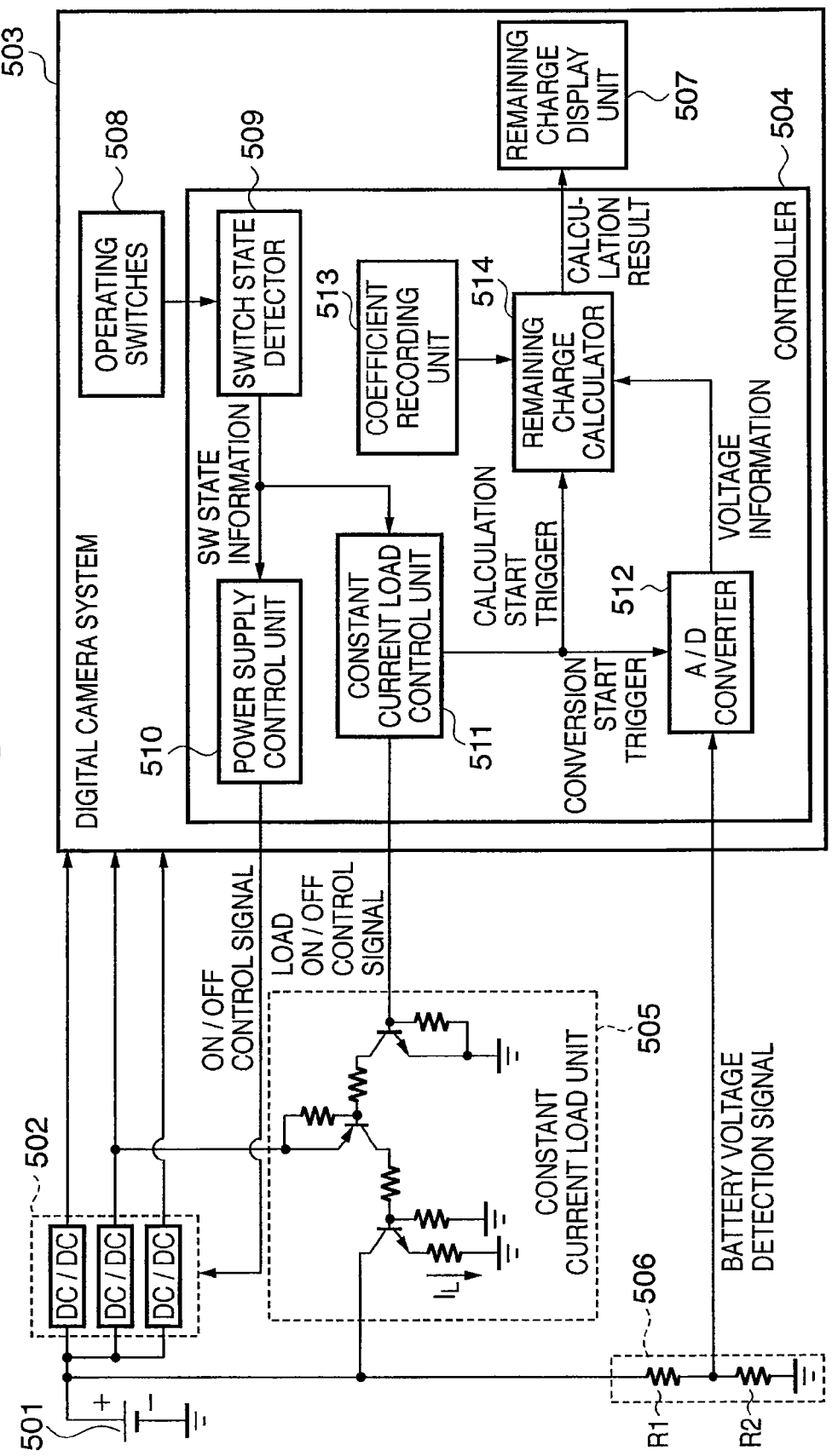
FIG. 16 is a block diagram showing one example of a conventional electronic device.
Figure 17:
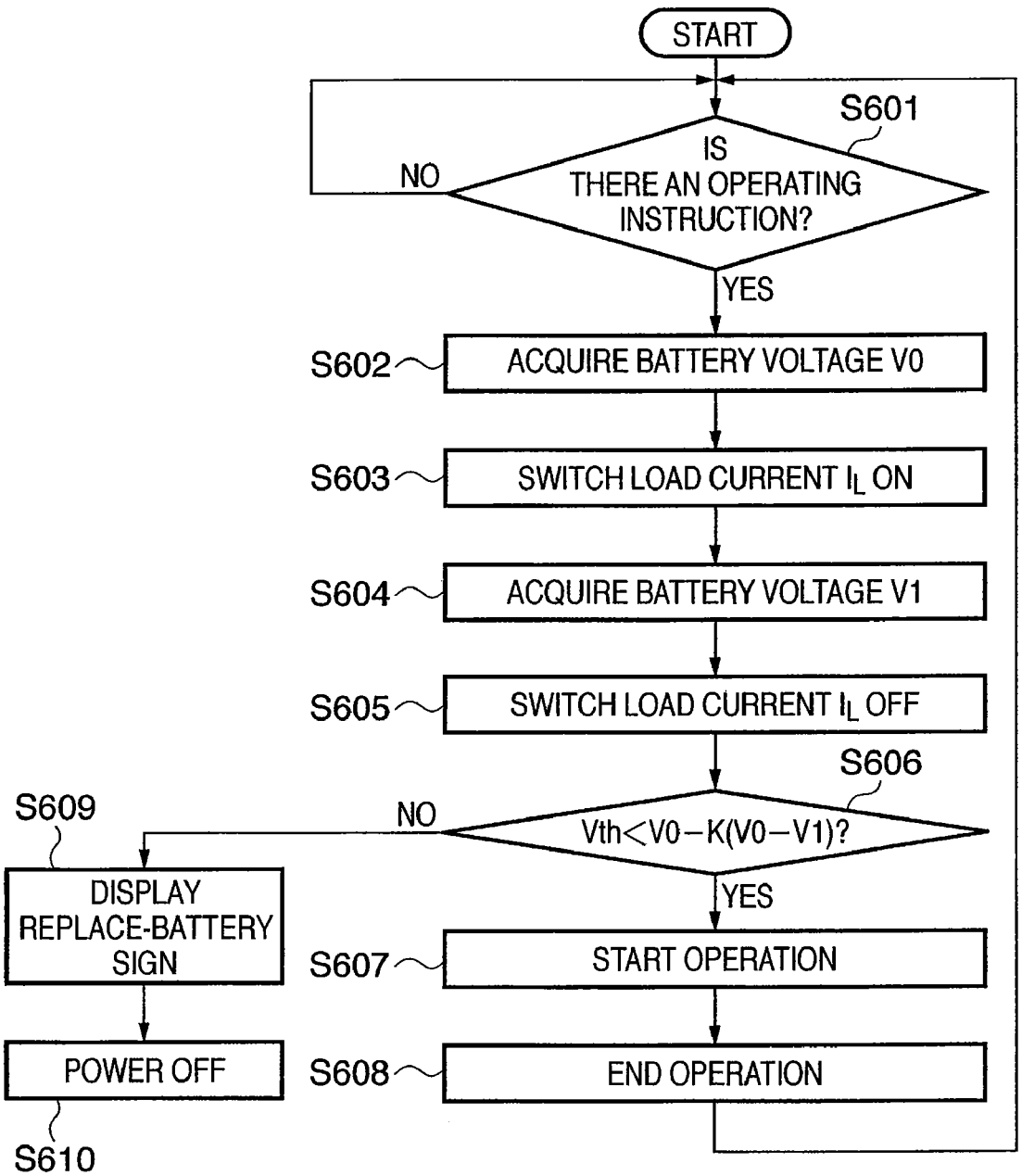
FIG. 17 is a flow chart illustrating processing performed by the conventional electronic device.
Figure 18:
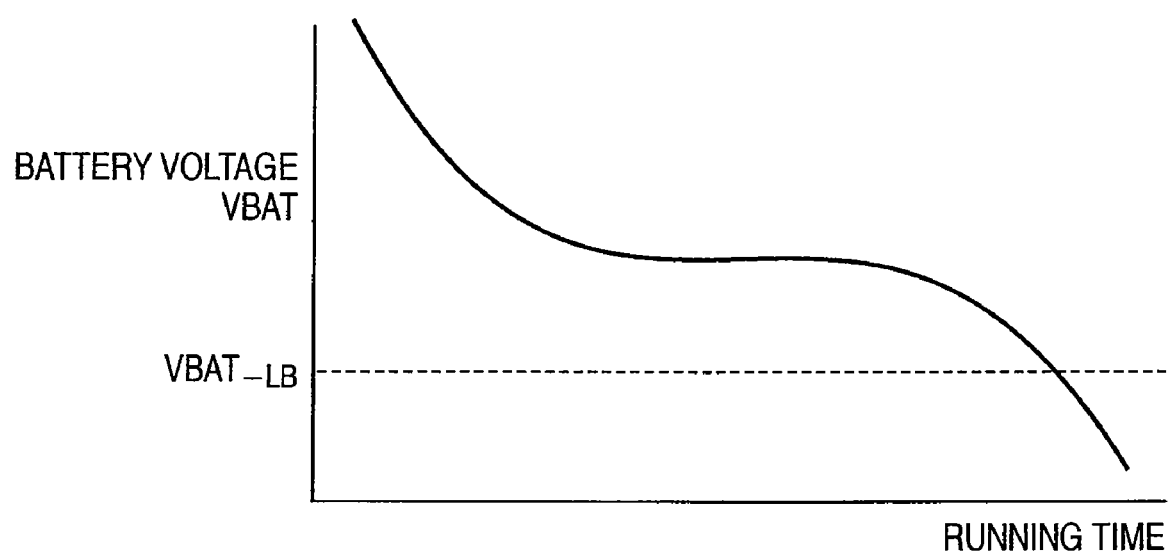
FIG. 18 is a characteristics graph showing the discharge characteristics of a battery.

Next, a description will be given of the operation of the digital camera of the seventh embodiment, using the flow chart shown in FIG. 15.

First, the digital camera stands by awaiting input of a camera operating instruction 1 from the operating switches 408 (step S501). Then, once camera operating instruction 1 is input from the operating switches 408, the digital camera system 450, through the battery voltage detector 406, acquires the present battery voltage information V"0 digitally converted by the A/D converter 412 (step S502).

Next, after acquiring the battery voltage information V"0, the remaining charge calculator 414 carries out a comparison of the battery voltage information V"0 and a predetermined lower limit threshold voltage V"th0 at which a remaining battery charge estimation test to be described later is not conducted that is stored in the remaining charge calculation information recording unit 413 (step S503).

If the results of the comparison performed in step S503 indicate that V"th0<V"0, then it is determined that the operation input in step S501 can be executed and camera operation corresponding to the camera operating instruction input from the operating switches 408 is started (step S504). When the desired operation is finished, operation is ended (step S505). Thereafter, the process returns to step S501 and the next input is awaited.

If the results of the comparison conducted in step S503 indicate that V"th0≧V"0, the constant current load circuit control unit 411 switches the constant current load unit 405 ON, outputting a predetermined, desired load current I"L from the battery (step S506). Then, the constant current load circuit control unit 411 acquires battery voltage information V"1, which is the battery voltage at this time digitally converted by the A/D converter 412 (step S507).

After the battery voltage information V"1 is acquired, the constant current load circuit control unit 411 switches the constant current load unit 405 OFF (step S508) and the remaining charge calculator 414 carries out the following calculation process and comparison (step S509):

$$V"th1 < V"0 - K"\Delta V" \quad (10)$$

$$\Delta V" = V"0 - V"1 \quad (11)$$

where V"th1 is a predetermined lower limit threshold voltage at which the camera can operate and K" is an arbitrary coefficient predetermined for each camera operation input using the operating switches 408, which is stored in the remaining charge calculation information recording unit 413.

If the results of the calculation process and comparison described above and carried out at the remaining charge calculator 414 (step S509) indicate that the calculation process results are less than or equal to V"th1, it is determined that the operation designated in step S501 cannot be executed, a replace-battery sign is displayed in the remaining charge display unit 407 (step S510), and the power supply unit control unit 410 switches the power supply unit 402 OFF (step S511).

If the results of the calculation process and comparison described above in step S509 indicate that the calculation process results are greater than V"th1, then it is determined that the operation designated in step S501 can be executed and operation is started (step S512). Once the desired operation is finished, operation is ended (step S513). In the present embodiment, after the operation is finished, the digital camera system 450 switches the timer circuit 455 ON and begins to count time until the next camera operation input using the operating switches 408.

Next, the process proceeds to step S515 and the next input is awaited. Then, once a camera operating instruction is input using the operating switches 408, the digital camera system 450 switches the timer circuit 455 OFF (step S516) and carries out a comparison to determine whether or not operating instruction 2 indicates the same operation as operating instruction 1 (step S517).

If the results of the comparison carried out in step S517 indicate that operating instruction 2 indicates an operation different from operating instruction 1, the process returns to step S502, the battery voltage V"0 is once again measured, and processing is executed once more according to the process steps described above.

If the results of the comparison carried out in step S517 indicate that operating instruction 2 is the same as operating instruction 1, a comparison is conducted of a time T"th from step S514 to step S516 and an arbitrary time $T''_{ON}$ that is predetermined by the remaining charge calculation information recording unit 413 (step S518).

If the results of the comparison made in step S518 indicate that $T''_{ON}$ is longer than T"th, the process returns to step S502, the battery voltage V"0 is once again measured, and processing is executed once more according to the process steps described above.

By contrast, if the results of the comparison made in step S518 indicate that $T''_{ON}$ is shorter than T"th, it is then determined that operating instruction 2 can be executed, operation is started (step S519), and, once the desired operation is finished, operation is ended (step S513).

It should be noted that the lower limit threshold voltage V"th0 at which the remaining battery charge estimation test is not carried out, the predetermined lower limit threshold voltage V"th1 at which camera operation is still possible, and the time T"th from step S514 to step S516 may be changed with each type of camera operation input using the operating switches 408.

In addition, these variables may be changed using the arbitrary coefficients K" predetermined in advance for each camera operation designated by the operating switches 408. For example, when carrying out a remaining battery charge estimation test for conducting an operation that uses a large amount of current, such as moving the lens barrel or charging the flash, the lower limit threshold K" may be made a large value, and the system may be operated in such a way that the lower limit threshold voltage V"th0 at which the remaining battery charge estimation test is not carried out as well as the predetermined lower limit threshold voltage V"th1 at which camera operation is still possible are increased. Conversely, the system may be operated so as to shorten the time T"th from step S514 to step S516.

These variable reference values are also stored in the remaining charge calculation information recording unit 413. In addition, if the comparison conducted in step S517 indicates that operating instruction 2 indicates an operation different from operating instruction 1, the process may shift to step S518 where operating instruction 2 can be carried out at lower power than with operating instruction 1.

The foregoing procedure reduces the number of times the remaining battery charge estimation test is conducted prior to the execution of each operation, enabling power consumption to be reduced.

Other Embodiments of the Present Invention

The various means that comprise the electronic devices of the above embodiments of the present invention described, as well as the remaining battery charge estimation method and the electronic device control method, can be implemented by the operation of a program stored in the RAM or ROM of a computer. Such a program, as well as the computer-readable recording medium on which the program is recorded, are also included within the scope of the present invention.

In addition, such embodiments of the present invention as, for example, a system, an apparatus, a method, a program or a storage medium, are also feasible. Specifically, the present invention may be adapted to either a system composed of a plurality of devices or an apparatus composed of a single device.

It should be noted that, in the present invention, a software program that implements the functions of the embodiments described above (that is, a program that corresponds to the flow charts shown in FIGS. 2, 4, 6, 8, 9, 11, 13 and 15 of the embodiments) may be supplied either directly or indirectly to a system or an apparatus. In that case, an arrangement in which the same functions as those described above are implemented by a computer of the system or apparatus outputting and executing the supplied program code is also within the scope of the present invention.

Accordingly, since a computer implements the functional processes of the present invention, a program installed in the computer itself also accomplishes the present invention. In other words, the computer program for implementing the functional processes of the invention is itself also included within the scope of the present invention.

In that case, so long as the system or apparatus has the capabilities of the program, the program may be executed in any form, such as an object code, a program executed by an interpreter, or script data supplied to an OS.

Example of storage media that can be used for supplying the program are a floppy disk, a hard disk, an optical disk, a magneto-optical disk, a CD-ROM, a CD-R, a CD-RW, a magnetic tape, a non-volatile type memory card, a ROM, and a DVD (DVD-ROM and a DVD-R).

As for the method of supplying the program, a client computer can be connected to a website on the Internet using a browser of the client computer, and the computer program of the present invention or an automatically-installable compressed file of the program can be downloaded to a recording medium such as a hard disk. Further, the program of the present invention can be supplied by dividing the program code constituting the program into a plurality of files and downloading the files from different websites. In other words, a WWW (World Wide Web) server that downloads, to multiple users, the program files that implement the functions of the present invention by computer is also covered by the claims of the present invention.

It is also possible to encrypt and store the program of the present invention on a storage medium such as a CD-ROM, distribute the storage medium to users, allow users who meet certain requirements to download decryption key information from a website via the Internet, and allow these users to decrypt the encrypted program by using the key information, whereby the program is installed in the user computer.

Besides the cases where the aforementioned functions according to the embodiments are implemented by executing the read program by computer, an operating system or the like running on the computer may perform all or a part of the actual processing so that the functions of the foregoing embodiments can be implemented by this processing.

Furthermore, after the program read from the storage medium is written to a function expansion board inserted into the computer or to a memory provided in a function expansion unit connected to the computer, a CPU or the like mounted on the function expansion board or function expansion unit performs all or a part of the actual processing so that the functions of the foregoing embodiments can be implemented by this processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-099857 filed on Mar. 31, 2006, No.

2006-103650 filed on Apr. 4, 2006, and No. 2006-106499 filed on Apr. 7, 2006, which are hereby incorporated by reference herein in their entirety.

What is claimed is:

1. An electronic device, supplied with a battery voltage from a battery, comprising:
   a first power supply unit that converts the battery voltage to a first constant voltage;
   a second power supply unit that converts the battery voltage to a second constant voltage, which is higher than the first constant voltage;
   a constant current load unit that outputs a constant current;
   a load switching unit that connects the first power supply unit to the constant current load unit if the battery voltage is higher than a predetermined voltage, and connects the second power supply unit to the constant current load unit if the battery voltage is equal or less than the predetermined voltage; and
   a remaining charge calculator that calculates a remaining charge of the battery based on a first voltage, a second voltage, and a third voltage,
   wherein the constant current load unit outputs the constant current to the load switching unit, and
   wherein the first voltage is the battery voltage detected if the constant current is not outputted to the load switching unit, the second voltage is a load voltage supplied to the constant current load unit if the constant current is not outputted to the load switching unit, and the third voltage is the battery voltage detected if the constant current is outputted to the load switching unit.

2. The electronic device according to claim 1, wherein:
   the first voltage is detected before the second power supply unit is connected to the constant current load unit if the battery voltage is equal to or less than the predetermined voltage,
   the second voltage is detected after the second power supply unit is connected to the constant current load unit if the battery voltage is equal to or less than the predetermined voltage, and
   the third voltage is detected after the second power supply unit is connected to the constant current load unit if the battery voltage is equal to or less than the predetermined voltage.

3. The electronic device according to claim 1, wherein:
   the first voltage is detected before the first power supply unit is connected to the constant current load unit if the battery voltage is higher than the predetermined voltage,
   the second voltage is detected after the first power supply unit is connected to the constant current load unit if the battery voltage is higher than the predetermined voltage, and
   the third voltage is detected after the first power supply unit is connected to the constant current load unit if the battery voltage is higher than the predetermined voltage.

4. A method of controlling an electronic device for calculating remaining battery charge of a battery, which includes a first power supply unit that converts the battery voltage to a first constant voltage, a second power supply unit that converts the battery voltage to a second constant voltage, which is higher than the first constant voltage, a constant current load unit that outputs a constant current, and a load switching unit that connects the first power supply unit to the constant current load unit if the battery voltage is higher than a predetermined voltage, and connects the second power supply unit to the constant current load unit if the battery voltage is equal to or less than the predetermined voltage, the method comprising:
   a remaining charge calculation step of calculating a remaining charge of the battery based on a first voltage, a second voltage, and a third voltage,
   wherein the constant current load unit outputs the constant current to the load switching unit, and
   wherein the first voltage is the battery voltage detected if the constant current is not outputted to the load switching unit, the second voltage is a load voltage supplied to the constant current load unit if the constant current is not outputted to the load switching unit, and the third voltage is the battery voltage detected if the constant current is outputted to the load switching unit.

5. The method according to claim 4, wherein:
   the first voltage is detected before the second power supply unit is connected to the constant current load unit if the battery voltage is equal to or less than the predetermined voltage,
   the second voltage is detected after the second power supply unit is connected to the constant current load unit if the battery voltage is equal to or less than the predetermined voltage, and
   the third voltage is detected after the second power supply unit is connected to the constant current load unit if the battery voltage is equal to or less than the predetermined voltage.

6. The method according to claim 4, wherein:
   the first voltage is detected before the first power supply unit is connected to the constant current load unit if the battery voltage is higher than the predetermined voltage,
   the second voltage is detected after the first power supply unit is connected to the constant current load unit if the battery voltage is higher than the predetermined voltage, and
   the third voltage is detected after the first power supply unit is connected to the constant current load unit if the battery voltage is higher than the predetermined voltage.

* * * * *